US009464210B2

(12) United States Patent
Hatakeyama et al.

(10) Patent No.: US 9,464,210 B2
(45) Date of Patent: *Oct. 11, 2016

(54) BACK SHEET FOR SOLAR CELL, METHOD FOR PRODUCING THE SAME, AND SOLAR CELL MODULE

(75) Inventors: Akira Hatakeyama, Kanagawa (JP); Yusuke Akasaki, Kanagawa (JP); Yohei Aritoshi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/579,014

(22) PCT Filed: Feb. 22, 2011

(86) PCT No.: PCT/JP2011/054429
§ 371 (c)(1),
(2), (4) Date: Aug. 14, 2012

(87) PCT Pub. No.: WO2011/105597
PCT Pub. Date: Sep. 1, 2011

(65) Prior Publication Data
US 2012/0305078 A1    Dec. 6, 2012

(30) Foreign Application Priority Data

Feb. 23, 2010 (JP) ................. 2010-037869
Nov. 12, 2010 (JP) ................. 2010-254209
Feb. 21, 2011 (JP) ................. 2011-035131

(51) Int. Cl.
| H01L 31/048 | (2014.01) |
| B32B 9/04 | (2006.01) |
| C09D 183/04 | (2006.01) |
| C08J 7/04 | (2006.01) |
| H01L 31/049 | (2014.01) |

(52) U.S. Cl.
CPC .............. *C09D 183/04* (2013.01); *C08J 7/047* (2013.01); *H01L 31/049* (2014.12); *C08J 2367/02* (2013.01); *C08J 2433/00* (2013.01); *Y02E 10/50* (2013.01); *Y10T 428/265* (2015.01); *Y10T 428/31663* (2015.04)

(58) Field of Classification Search
None
See application file for complete search history.

(56) References Cited

U.S. PATENT DOCUMENTS

| 5,104,929 | A | 4/1992 | Bilkadi | |
| 6,313,335 | B1 * | 11/2001 | Roberts et al. | 556/419 |
| 2008/0050583 | A1 | 2/2008 | Kubo | |
| 2009/0036597 | A1 * | 2/2009 | Shibata et al. | 524/588 |
| 2009/0264579 | A1 * | 10/2009 | Kitawaki | 524/502 |
| 2010/0000603 | A1 * | 1/2010 | Tsuzuki et al. | 136/259 |
| 2011/0023945 | A1 * | 2/2011 | Hayashi et al. | 136/251 |

FOREIGN PATENT DOCUMENTS

| CN | 1284970 A | 2/2001 |
| DE | 10 2005 058 014 A1 | 1/2007 |
| EP | 1006165 A2 | 6/2000 |
| EP | 1938967 A1 | 7/2008 |
| EP | 2 204 281 A1 | 7/2010 |
| EP | 2273560 A1 | 1/2011 |
| JP | 2002-100788 A | 4/2002 |
| JP | 2003-60218 A | 2/2003 |
| JP | 2005-225956 A | 8/2005 |
| JP | 2006-210557 A | 8/2006 |
| JP | 2007-128943 A | 5/2007 |
| JP | 2008-189828 A | 8/2008 |
| JP | 2008-282873 A | 11/2008 |
| JP | 2009-10097 A | 1/2009 |
| JP | 2009-71236 A | 4/2009 |
| WO | WO 2009/133827 A1 | 11/2009 |
| WO | WO 2011/087156 A1 | 7/2011 |

OTHER PUBLICATIONS

International Search Report for PCT/JP2011/054429 mailed on May 12, 2011.
Written Opinion of the International Searching Authority for PCT/JP2011/054429 mailed on May 12, 2011.
European Office Action dated Sep. 4, 2013 issued in corresponding European Patent Application No. 11 708 583.7.
English language translation of Abstract of DE 10 2005 058 014 (patent issued Jan. 25, 2007).
Japanese Office Action dated Mar. 25, 2014, issued in corresponding Japanese Patent Application No. 2011-035131.
Chinese Office Action, issued Mar. 13, 2015, for Chinese Application No. 201180009340.5, along with an English translation.
Zhang et al., "Analysis on Polymerization Stability of Organic Siloxane Modified Acrylate Emulsion," Paint & Coatings Industry, vol. 35, No. 5, May 2005, pp. 11-15, 62.
Chinese Office Action dated Jul. 17, 2015, issued in corresponding Chinese Patent Application No. 201180009340.5.
Chinese Office Action dated Aug. 28, 2014, issued in corresponding Chinese Patent Application No. 201180009340.5.

* cited by examiner

*Primary Examiner* — Kenneth Stachel
(74) *Attorney, Agent, or Firm* — Birch, Stewart, Kolasch & Birch, LLP

(57) ABSTRACT

A back sheet for a solar cell to be disposed in contact with a sealing material of a cell-side substrate in which a solar cell device is sealed with the sealing material, the back sheet including: a polymer base material; and a polymer layer that is provided on the polymer base material and contains a composite polymer that contains, in a molecule, 15% by mass to 85% by mass of siloxane structural units represented by the following formula (1) and 85% by mass to 15% by mass of non-siloxane structural units: wherein $R^1$ and $R^2$ each independently represent a hydrogen atom, a halogen atom, or a monovalent organic group; $R^1$ and $R^2$ may be identical with or different from each other; and n is an integer of 1 or more.

(1)

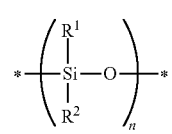

14 Claims, No Drawings

BACK SHEET FOR SOLAR CELL, METHOD FOR PRODUCING THE SAME, AND SOLAR CELL MODULE

TECHNICAL FIELD

The present invention relates to a back sheet for a solar cell to be installed on a side opposite to a sunlight incident side of a solar cell device, a method for producing the back sheet, and a solar cell module.

BACKGROUND ART

Solar cells are power generating systems which do not discharge carbon dioxide during power generation and have little adverse effect on the environment, and in recent years, solar cells have been rapidly popularized.

A solar cell module in general has a structure in which a solar cell is sandwiched between a front surface glass on a side where sunlight enters, and a so-called back sheet that is disposed on a side opposite to a side where sunlight enters (rear surface side). The spaces between the front surface glass and the solar cell and between the solar cell and the back sheet are respectively sealed with an EVA (ethylene-vinyl acetate) resin or the like.

The back sheet has a function of preventing the penetration of moisture from the rear surface of a solar cell module, and glass, a fluororesin and the like have been traditionally used. However, in recent years, polyester has been increasingly used from the viewpoint of cost. Furthermore, the back sheet is not necessarily a mere polymer sheet, but may be imparted with various functions such as those described below.

Regarding the functions described above, for example, there may be a demand for imparting a reflection performance by adding white inorganic fine particles such as titanium oxide to the back sheet. This is because when the portion of light in the sunlight that is incident through the front surface of the module and passes through the cell is diffusely reflected and returned to the cell, the power generation efficiency is increased. In this regard, an example of a white polyethylene terephthalate film with added white inorganic fine particles has been disclosed (see, for example, Japanese Patent Application Laid-Open (JP-A) No. 2003-060218 and JP-A No. 2006-210557), and an example of a rear surface protective sheet having a white ink layer containing a white pigment has also been disclosed (see, for example, JP-A No. 2006-210557).

Furthermore, there are cases where the back sheet is required to have decorativeness. In this regard, there has been disclosed an example of a back sheet for a solar cell to which a perylene pigment, which is a black pigment, has been added to improve decorativeness (see, for example, JP-A No. 2007-128943).

Furthermore, there are cases where a polymer layer is provided as the outermost layer of a back sheet in order to obtain strong adhesion between the back sheet and an EVA sealing material. In this regard, there has been disclosed a technology of providing a thermally adhesive layer on a white polyethylene terephthalate film (see, for example, JP-A No. 2003-060218).

In order to impart functions such as described above, the back sheet has a structure in which a layer having another function is laminated on a support. Examples of lamination methods may include a method of affixing sheets having various functions on a support. For example, there has been disclosed a method of forming a back sheet by affixing plural resin films (see, for example, JP-A No. 2002-100788). Furthermore, as a method of forming a back sheet at lower cost than the method of affixing, there has been disclosed a method of coating layers having various functions on a support (see, for example, JP-A No. 2006-210557 and JP-A No. 2007-128943).

Further, there is a disclosure regarding a white polyester film for a reflective plate in which a coating layer containing an antistatic agent and a silicone compound is provided on a white polyester film, or a back sheet for a solar cell in which an adhesion layer containing an epoxy resin, a phenol resin, a vinyl copolymer or a siloxane compound is laminated on an organic film (see, for example, JP-A No. 2008-189828 and JP-A No. 2008-282873).

However, although there are available technologies disclosed in connection with the method of forming a back sheet by affixing, these technologies involve high cost, are inferior in interlayer adhesiveness in long-term use, and are unsatisfactory in terms of durability. That is, since back sheets are directly exposed to moisture, heat or light, the back sheets are required to have durability with respect thereto for a long time. For example, back sheets generally have a structure adhered to an EVA sealing material, and in this case, the adhesion durability over time between the back sheet and the EVA is extremely important. Furthermore, the adhesion durability between the support and the respective layers is also indispensable.

There have been also disclosed methods involving coating. However, it is difficult to maintain adhesiveness for a long time in an environment with relatively high temperature and humidity, and these methods are not yet satisfactory in providing a back sheet for a solar cell which can be produced at low cost and achieves a good balance between light reflectivity or the like and adhesiveness to an EVA sealing material.

Regarding the above polyester film or back sheet containing a silicone compound or a siloxane compound, the former is inferior in the durability of the cationic polymer contained as an antistatic agent, and the latter is inferior in the durability of a resin or a copolymer other than the siloxane compound, so that it is difficult to maintain the adhesiveness over a long period of time in an environment with relatively high humidity and temperature.

As described above, in the current situation, there has not yet been provided a back sheet for a solar cell, which has both adhesiveness to EVA sealing materials that lasts for a long time and other functions (for example, reflection performance or decorativeness), and which, at the same time, can be produced at low cost and can provide satisfactory durability with respect to moisture and heat.

SUMMARY OF INVENTION

The invention has been made in view of the above circumstances, and it is an object of the invention to provide a back sheet for a solar cell which is excellent in the adhesion durability between various layers and the adhesion durability to the constituent base material of the back sheet or a cell-side substrate (for example, a sealing material such as EVA) in a hot and humid environment, and can be produced at low cost, a method for producing the back sheet, and an inexpensive solar cell module having stable power generation efficiency.

Exemplary embodiments of the invention are, for example, as follows.

<1> A back sheet for a solar cell to be disposed in contact with a sealing material of a cell-side substrate in which a solar cell device is sealed with the sealing material, the back sheet comprising:
a polymer base material; and
a polymer layer that is provided on the polymer base material and contains a composite polymer that contains, in a molecule, 15% by mass to 85% by mass of siloxane structural units represented by the following formula (1) and 85% by mass to 15% by mass of non-siloxane structural units:

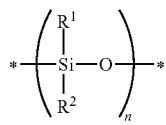

Formula (1)

wherein $R^1$ and $R^2$ each independently represent a hydrogen atom, a halogen atom, or a monovalent organic group; $R^1$ and $R^2$ may be identical with or different from each other; n is an integer of 1 or more; when a plurality of $R^1$s are present, they may be identical with or different from each other; and when a plurality of $R^2$s are present, they may be identical with or different from each other.

<2> The back sheet for a solar cell according to <1>, wherein the polymer layer comprises a structural portion derived from a crosslinking agent for crosslinking the composite polymer.

<3> The back sheet for a solar cell according to <1> or <2>, wherein the non-siloxane structural units comprise acrylic structural units.

<4> The back sheet for a solar cell according to <2> or <3>, wherein the crosslinking agent is at least one selected from a carbodiimide compound or an oxazoline compound.

<5> The back sheet for a solar cell according to any one of <2> to <4>, wherein in the polymer layer, a mass content of the structural portion derived from the crosslinking agent is from 1% by mass to 30% by mass based on the content of the composite polymer.

<6> The back sheet for a solar cell according to any one of <1> to <5>, wherein the polymer base material has been subjected to at least one surface treatment selected from the group consisting of a corona treatment, a flame treatment, a low pressure plasma treatment, an atmospheric pressure plasma treatment, and an ultraviolet treatment.

<7> The back sheet for a solar cell according to any one of <1> to <6>, wherein the monovalent organic group represented by $R^1$ or $R^2$ is at least one selected from the group consisting of an alkyl group, an aryl group, an aralkyl group, an alkoxy group, an aryloxy group, a mercapto group, an amino group and an amide group.

<8> The back sheet for a solar cell according to any one of <1> to <7>, wherein the polymer base material comprises a polyester resin having a carboxy group content in the range of from 2 equivalents/ton to 35 equivalents/ton.

<9> The back sheet for a solar cell according to any one of <1> to <8>, wherein the polymer layer has a thickness of from 0.8 μm to 12 μm.

<10> The back sheet for a solar cell according to any one of <1> to <9>, wherein the polymer layer is provided in contact with a surface of the polymer base material.

<11> The back sheet for a solar cell according to any one of <1> to <10>, wherein the polymer layer is an outermost layer which is disposed at the most distant position from the polymer base material.

<12> The back sheet for a solar cell according to any one of <1> to <11>, wherein the polymer layer further contains a white pigment and is a reflective layer having light reflectivity.

<13> The back sheet for a solar cell according to any one of <1> to <11>, comprising at least two of the polymer layers, wherein one of the polymer layers further contains a white pigment and is a reflective layer having light reflectivity, and another of the polymer layers is disposed between the reflective layer and the polymer base material.

<14> The back sheet for a solar cell according to any one of <1> to <11>, further comprising a reflective layer which contains a white pigment and has light reflectivity, wherein the polymer layer is disposed between the reflective layer and the polymer base material. The reflective layer and the polymer base material are preferably bonded by the polymer layer.

<15> A method for producing a back sheet for a solar cell, the method comprising forming at least one polymer layer by applying, on a polymer base material, a coating liquid containing a composite polymer that contains, in a molecule, 15% by mass to 85% by mass of siloxane structural units represented by the following formula (1) and 85% by mass to 15% by mass of non-siloxane structural units:

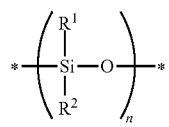

Formula (1)

wherein $R^1$ and $R^2$ each independently represent a hydrogen atom, a halogen atom, or a monovalent organic group; $R^1$ and $R^2$ may be identical with or different from each other; n is an integer of 1 or more; when a plurality of $R^1$s are present, they may be identical with or different from each other; and when a plurality of $R^2$s are present, they may be identical with or different from each other.

<16> The method for producing a back sheet for a solar cell according to <15>, wherein the coating liquid further contains a crosslinking agent selected from a carbodiimide compound or an oxazoline compound.

<17> The method for producing a back sheet for a solar cell according to <15> or <16>, wherein the coating liquid further contains a solvent, and 50% by mass or more of the solvent is water.

<18> A solar cell module comprising the back sheet for a solar cell according to any one of <1> to <14> or a back sheet for a solar cell produced by the method for producing a back sheet for a solar cell according to any one of <15> to <17>.

<19> A solar cell module comprising:
a transparent front substrate through which sunlight enters;
a cell structural portion which is provided on the front substrate and comprises a solar cell device and a sealing material that seals the solar cell device; and
the back sheet for a solar cell according to any one of <1> to <14> or a back sheet for a solar cell produced by the method for producing a back sheet for a solar cell according to any one of <15> to <17>, provided on a side of the cell structural portion opposite to a side thereof on which the front substrate is provided, so as to be adjacent to the sealing material.

According to the invention, there may be provided a back sheet for a solar cell which is excellent in the adhesion durability between various layers and the adhesion durability to the constituent base material of the back sheet or a cell-side substrate (for example, a sealing material such as EVA) in a hot and humid environment, and can be produced at low cost, and a method for producing the back sheet.

Furthermore, according to the invention, there may be provided an inexpensive solar cell module having stable power generation efficiency.

DESCRIPTION OF EMBODIMENTS

Hereinafter, the back sheet for a solar cell of the invention, a method for producing the back sheet, and a solar cell module will be described in detail.

<Back Sheet for Solar Cell and Method for Producing the Back Sheet>

The back sheet for a solar cell of the invention is a back sheet for a solar cell to be disposed in contact with a sealing material of a cell-side substrate in which a solar cell device is sealed with the sealing material. The back sheet includes a polymer base material, and a polymer layer which is provided on the polymer base material and contains a composite polymer that contains, in a molecule, 15% by mass to 85% by mass of siloxane structural units represented by the following formula (1) and 85% by mass to 15% by mass of non-siloxane structural units.

Here, $R^1$ and $R^2$ mentioned above each independently represent a hydrogen atom, a halogen atom, or a monovalent organic group, and $R^1$ and $R^2$ may be identical with or different from each other. In addition, n represents an integer of 1 or more.

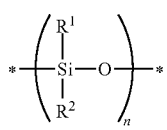

Formula (1)

In formula (1), $R^1$ and $R^2$ each independently represent a hydrogen atom, a halogen atom, or a monovalent organic group; $R^1$ and $R^2$ may be identical with or different from each other; n is an integer of 1 or more; when a plurality of $R^1$s are present, they may be identical with or different from each other; and when a plurality of $R^2$s are present, they may be identical with or different from each other.

According to the invention, since the polymer layer, which is a constituent layer of the back sheet, is constructed using a particular composite polymer containing; in a molecule, non-siloxane structural units and (poly)siloxane structural units copolymerized therewith, the adhesive power between various layers and the adhesive power to the polymer base material or a cell-side substrate (particularly, a sealing material such as EVA) are improved, and deterioration due to heat or moisture is suppressed. Therefore, the adhesive strength can be maintained high over a long time period under environmental conditions that are exposed to heat or moisture for a long time, and long-term durability can be secured. Thereby, when a solar cell module is constructed, satisfactory power generation performance is obtained, and at the same time, the power generation efficiency can be maintained stable for a long time.

The polymer layer according to the invention can be applied to any layer that constitutes a back sheet. The polymer layer can be applied to, for example, a reflective layer or a back layer (which will be described below), or an adhesive layer that adheres between a functional layer such as a reflective layer and a polymer base material. Since the durability of the polymer layer in a hot and humid environment of heat or moisture is excellent, it is also particularly preferable to use the polymer layer as a polymer layer that is disposed between a reflective layer containing a white pigment or the like and a polymer base material, among the constituent layers of a back sheet, or as a back layer, which is an outermost layer exposed to external environment in a case when constructed into a solar cell module.

(Polymer Base Material)

Examples of the polymer base material include a polyester, a polyolefin such as polypropylene or polyethylene, and a fluoropolymer such as polyvinyl fluoride. Among these, polyesters are preferred from the viewpoints of cost, mechanical strength, and the like.

The polyester that is used as a polymer base material (support) according to the invention may be a linear saturated polyester that is synthesized from an aromatic dibasic acid or an ester-forming derivative thereof and a diol or an ester-forming derivative thereof. Specific examples of such a polyester include polyethylene terephthalate, polyethylene isophthalate, polybutylene terephthalate, poly(1,4-cyclohexylenedimethylene terephthalate), and polyethylene-2,6-naphthalate. Among these, polyethylene terephthalate or polyethylene-2,6-naphthalate is particularly preferable from the viewpoints of the balance between mechanical properties and cost.

The polyester may be a homopolymer, or may be a copolymer. Furthermore, the polyester may be blended with a small amount of a different type of resin, for example, a polyimide.

In order to polymerize the polyester according to the invention, it is preferable to use a Sb, Ge or Ti compound as a catalyst from the viewpoints of suppressing the carboxy group content to a value equal to or less than a predetermined range, and among them, a Ti compound is particularly preferable. In the case of using a Ti compound, an embodiment of performing polymerization using a Ti compound as a catalyst in an amount that corresponds to a content of Ti element of from 1 ppm to 30 ppm, and more preferably from 3 ppm to 15 ppm is preferable. When the amount of use of the Ti compound is in the range described above, the amount of terminal carboxy groups can be adjusted to a range such as described below, and the resistance to hydrolysis of the polymer base material can be maintained high.

In the synthesis of a polyester using a Ti compound, the methods described in, for example, Japanese Examined Patent Application (JP-B) No. 8-301198, Japanese Patent Nos. 2543624, 3335683, 3717380, 3897756, 3962226, 3979866, 3996871, 4000867, 4053837, 4127119, 4134710, 4159154, 4269704 and 4313538, can be applied.

The carboxy group content in the polyester is preferably 55 equivalents/t (ton; hereinafter, the same) or less, and more preferably 35 equivalents/t or less. The lower limit of the carboxy group content is preferably 2 equivalents/t, from the viewpoints of retaining adhesiveness to layers that are formed on the polyester (for example, a colored layer). When the carboxy group content is 55 equivalents/t or less, the polyester can retain resistance to hydrolysis, and lowering of strength over time in the presence of heat and moisture can be suppressed.

The carboxy group content in the polyester can be adjusted by the type of the polymerization catalyst or the conditions for film formation (temperature or time for film formation).

The polyester according to the invention is preferably subjected to solid phase polymerization, after being polymerized. Thereby, a preferred carboxy group content can be achieved. The solid phase polymerization may be carried out by a continuous method (a method of packing a resin in a tower, allowing the resin to be slowly retained for a predetermined time under heating, and then discharging the resin), or may be carried out by a batch method (a method of introducing a resin into a vessel, and heating the resin for a predetermined time). Specifically, the methods described in Japanese Patent Nos. 2621563, 3121876, 3136774, 3603585, 3616522, 3617340, 3680523, 3717392, and 4167159 can be applied to the solid phase polymerization.

The temperature for solid phase polymerization is preferably from 170° C. to 240° C., more preferably from 180° C. to 230° C., and even more preferably from 190° C. to 220° C. Furthermore, the time for solid phase polymerization is preferably from 5 hours to 100 hours, more preferably from 10 hours to 75 hours, and even more preferably from 15 hours to 50 hours. The solid phase polymerization is preferably carried out in a vacuum or in a nitrogen atmosphere.

The polyester base material according to the invention is preferably a biaxially stretched film obtained by, for example, performing melt extrusion of a polyester mentioned above into a film form, subsequently cooling and solidifying the film with a casting drum to obtain an unstretched film, stretching this unstretched film at Tg to (Tg+60)° C. in the longitudinal direction once or two or more times, so as to achieve a total draw ratio of 3 times to 6 times; and then stretching the resultant film at Tg to (Tg+60)° C. in the width direction so as to achieve a draw ratio of 3 to 5 times.

Furthermore, a heat treatment may be optionally carried out at 180° C. to 230° C. for 1 to 60 seconds.

The thickness of the polymer base material (particularly, polyester base material) is preferably about 25 μm to 300 μm. When the thickness is 25 μm or greater, mechanical strength is satisfactory. When the thickness is 300 μm or less, it is advantageous in terms of cost.

Particularly, a polyester base material has a tendency that as the thickness increases, the resistance to hydrolysis is deteriorated, and the durability decreases during a long-term use. According to the invention, when the thickness is from 120 μm to 300 μm, and the carboxy group content in the polyester is 2 equivalents/t to 35 equivalents/t, an effect of further enhancing the durability against moisture and heat is provided.

In a preferable embodiment, the polymer base material is surface treated by a corona treatment, a flame treatment, a low pressure plasma treatment, an atmospheric pressure plasma treatment, or an ultraviolet treatment. When such a surface treatments is carried out, the adhesiveness when exposed to a hot and humid environment may be further improved. In particular, by carrying out a corona treatment, a further excellent adhesiveness improving effect may be obtained.

When the surface treatments is carried out, carboxyl groups or hydroxyl groups are increased on a surface of the polymer base material (for example, a polyester base material), thereby improving the adhesiveness. Use of a crosslinking agent (in particular, an oxazoline or carbodiimide crosslinking agent, which is highly reactive with a carboxyl group) in combination with the surface treatment leads to further strong adhesiveness. This phenomenon is remarkably observed in the case of a corona treatment.

(Polymer Layer)

The polymer layer of the invention is a layer that is disposed directly, or via another layer, on the surface of the polymer base material. The polymer layer contains at least a particular composite polymer containing, in a molecule, non-siloxane structural units and (poly)siloxane structural units represented by the following formula (1). The polymer layer according to the invention is preferably formed directly on the polymer base material, because adhesion to the polymer base material, and interlayer adhesion (in particular, adhesion to a sealing material of a cell-side substrate) are improved by the constitution including the composite polymer. Since the polymer layer has durability with respect to moisture and heat, the polymer layer is preferably formed as a back layer, which is an outermost layer exposed to external environment.

This polymer layer may optionally further contain another component, and the constituent component varies according to the use applications. The polymer layer can constitute a colored layer which has a function of reflecting sunlight, or provision of external appearance design, or a back layer that is disposed on the side opposite to the sunlight incident side.

In a case when the polymer layer is constructed as, for example, a reflective layer which reflects sunlight to the incident side, the polymer layer may further contain a colorant such as a white pigment. A reflective layer may be formed as a polymer layer by incorporating a composite polymer. A laminated structure of white layer (polymer layer)/polymer layer/polymer base material, which has two or more polymer layers on a polymer base material, may also be used. In this case, the adhesiveness and close adherence of the reflective layer in the back sheet can be further enhanced.

—Composite Polymer—

The polymer layer according to the invention contains at least one composite polymer that contains, in a molecule, 15% by mass to 85% by mass of (poly)siloxane structural units represented by the following formula (1) and 85% by mass to 15% by mass of non-siloxane structural units. Since the polymer layer contains this composite polymer, the adhesiveness to a polymer base material, which is a support, or an interlayer adhesiveness, or the adhesiveness to a cell-side substrate (particularly, a sealing material such as EVA), that is, peeling resistance and shape stability that are prone to undergo deterioration when heat or moisture is applied, can be dramatically enhanced as compared with conventional polymer layers.

The composite polymer according to the invention is a block copolymer in which a polysiloxane and at least one polymer are copolymerized. The polysiloxane and the polymer that is copolymerized may be respectively composed of a single compound, or may be composed of two or more kinds.

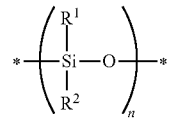

Formula (1)

In formula (1), $R^1$ and $R^2$ each independently represent a hydrogen atom, a halogen atom, or a monovalent organic group; $R^1$ and $R^2$ may be identical with or different from each other; n is an integer of 1 or more; when a plurality of $R^1$s are present, they may be identical with or different from each other; and when a plurality of $R^2$s are present, they may be identical with or different from each other.

In the "—(Si($R^1$)($R^2$)—O)$_n$—" moiety ((poly)siloxane structural units represented by formula (1)), which is a (poly)siloxane segment in the composite polymer, $R^1$ and $R^2$ may be identical with or different from each other, and each independently represent a hydrogen atom, a halogen atom, or a monovalent organic group.

The moiety "—(Si($R^1$)($R^2$)—O)$_n$—" is a (poly)siloxane segment derived from various (poly)siloxanes having a linear, branched or cyclic structure.

Examples of the halogen atom represented by $R^1$ and $R^2$ include a fluorine atom, a chlorine atom, a bromine atom, and an iodine atom.

The "monovalent organic group" represented by $R^1$ or $R^2$ is a group capable of covalent bonding with a Si atom, and may be unsubstituted or may be substituted. Examples of the monovalent organic group include an alkyl group (for example, a methyl group or an ethyl group), an aryl group (for example, a phenyl group), an aralkyl group (for example, a benzyl group or a phenylethyl group), an alkoxy group (for example, a methoxy group, an ethoxy group, or a propoxy group), an aryloxy group (for example, a phenoxy group), a mercapto group, an amino group (for example, an amino group or a diethylamino group), and an amide group.

Among them, from the viewpoints of adhesiveness to an adjacent material such as a polymer base material, and durability in a hot and humid environment, $R^1$ and $R^2$ are each independently preferably a hydrogen atom, a chlorine atom, a bromine atom, an unsubstituted or substituted alkyl, group having 1 to 4 carbon atoms (particularly, a methyl group or an ethyl group), an unsubstituted or substituted phenyl group, an unsubstituted or substituted alkoxy group, a mercapto group, an unsubstituted amino group, or an amide group, and more preferably an unsubstituted or substituted alkoxy group (preferably, an alkoxy group having 1 to 4 carbon atoms), from the viewpoints of durability in a hot and humid environment.

The above n is preferably from 1 to 5000, and more preferably from 1 to 1000.

The proportion of the —(Si($R^1$)($R^2$)—O)$_n$— moiety ((poly)siloxane structural units represented by formula (1)) in the composite polymer is 15% by mass to 85% by mass relative to the total mass of the composite polymer, and inter alia, from the viewpoints of adhesiveness to the polymer base material and durability in a hot and humid environment, the proportion is preferably in the range of 20% by mass to 80% by mass.

If the proportion of the polysiloxane moiety is less than 15% by mass, the adhesiveness to the polymer base material and the adhesion durability upon exposure to a hot and humid environment are deteriorated. If the proportion is greater than 85% by mass, the liquid becomes unstable.

There are no particular limitations on the non-siloxane structural units (a structural portion derived from a polymer) copolymerized with the siloxane structural units, except that the non-siloxane structural units have no siloxane structure, and any polymer segment derived from a polymer may be used as the non-siloxane structural units. Examples of a polymer that is a precursor of the polymer segment (precursor polymer) include various polymers such as a vinyl polymer, a polyester polymer, and a polyurethane polymer. From the viewpoints that preparation is easy and resistance to hydrolysis is excellent, a vinyl polymer and a polyurethane polymer are preferable, and a vinyl polymer is particularly preferable.

Representative examples of the vinyl polymer include various polymers such as an acrylic polymer, a carboxylic acid-vinyl ester polymer, an aromatic vinyl polymer and a fluoro-olefin polymer. Among them, from the viewpoints of the degree of freedom in design, an acrylic polymer is particularly preferable.

In addition, the polymer that constitute the non-siloxane structural units may be used alone, or two or more kinds may be used in combination.

Furthermore, the precursor polymer that constitutes the non-siloxane structural units preferably contains at least one of an acid group and a neutralized acid group, and/or a hydrolyzable silyl group. Among such precursor polymers, a vinyl polymer can be prepared by using various methods such as, for example, (1) a method of copolymerizing a vinyl monomer containing an acid group, and a vinyl monomer containing a hydrolyzable silyl group and/or a silanol group, with a monomer capable of being copolymerized with these monomers; (2) a method of allowing a vinyl polymer containing a hydroxyl group and a hydrolyzable silyl group and/or a silanol group, which has been prepared in advance, to react with a polycarboxylic acid anhydride; and (3) a method of allowing a vinyl polymer containing an acid anhydride group and a hydrolyzable silyl group and/or a silanol group, which has been prepared in advance, to react with a compound having active hydrogen (water, alcohol, amine or the like).

Such a precursor polymer can be produced and obtained by using the method described in, for example, paragraphs [0021] to [0078] of JP-A No. 2009-52011.

The polymer layer according to the invention may contain the composite polymer alone as a binder, or may contain the composite polymer in combination with another polymer. When another polymer is used in combination, the proportion of the composite polymer according to the invention is preferably 30% by mass or greater, and more preferably 60% by mass or greater, based on the total amount of binders. When the proportion of the composite polymer is 30% by mass or greater, the polymer layer is excellent in the adhesiveness to the polymer base material and the durability in a hot and humid environment.

The molecular weight of the composite polymer is preferably from 5,000 to 100,000, and more preferably from 10,000 to 50,000.

For the preparation of the composite polymer, use can be made of methods such as (i) a method of allowing a precursor polymer to react with a polysiloxane having a structure of the above formula (1) [—(Si($R^1$)($R^2$)—O)$_n$—], and (ii) a method of subjecting a silane compound having a structure of [—(Si($R^1$)($R^2$)—O)$_n$—] in which $R^1$ and/or $R^2$ is a hydrolyzable group, to hydrolysis and condensation in the presence of a precursor polymer.

Examples of the silane compound used in the method (ii) include various silane compounds, but an alkoxysilane compound is particularly preferable.

In the case of preparing a composite polymer by the method (i), the composite polymer can be prepared by, for example, allowing a mixture of a precursor polymer and a polysiloxane to react, while optionally adding water and a catalyst, at a temperature of about 20° C. to 150° C. for about 30 minutes to 30 hours (preferably, at 50° C. to 130° C. for 1 hour to 20 hours). As the catalyst, various silanol condensation catalysts such as an acidic compound, a basic compound, and a metal-containing compound, can be added.

Furthermore, in the case of preparing a composite polymer by the method (ii), the composite polymer can be prepared by, for example, adding water and a silanol condensation catalyst to a mixture of a precursor polymer and an alkoxysilane compound, and subjecting the mixture to hydrolysis and condensation at a temperature of about 20° C. to 150° C. for about 30 minutes to 30 hours (preferably, at 50° C. to 130° C. for 1 to 20 hours).

(Crosslinking Agent)

In the invention, the polymer layer preferably includes a structural portion derived from a crosslinking agent for performing crosslinking between molecules of the composite polymer. That is, the polymer layer may be formed using a crosslinking agent capable of performing crosslinking between molecules of the composite polymer. Due to the crosslinking by the crosslinking agent, the adhesiveness over time in the presence of moisture and heat, specifically the adhesion to the polymer base material and the interlayer adhesion when exposed to an environment with moisture and heat may be further improved.

Examples of the crosslinking agent include epoxy, isocyanate, melamine, carbodiimide and oxazoline crosslinking agents. Among them, carbodiimide compounds and oxazoline compounds are preferable as the crosslinking agents.

Specific examples of the oxazoline crosslinking agent include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis(2-oxazoline), 2,2'-methylene-bis(2-oxazoline), 2,2'-ethylene-bis(2-oxazoline), 2,2'-trimethylene-bis(2-oxazoline), 2,2'-tetramethylene-bis(2-oxazoline), 2,2'-hexamethylene-bis(2-oxazoline), 2,2'-octamethylene-bis(2-oxazoline), 2,2'-ethylene-bis(4,4'-dimethyl-2-oxazoline), 2,2'-p-phenylene-bis(2-oxazoline), 2,2'-m-phenylene-bis(2-oxazoline), 2,2'-m-phenylene-bis(4,4'-dimethyl-2-oxazoline), bis(2-oxazolinylcyclohexane) sulfide, and bis(2-oxazolinylnorbornane) sulfide. Furthermore, (co)polymers of these compounds are also preferably used.

Furthermore, as compounds having an oxazoline group, EPOCROS K2010E, EPOCROS K2020E, EPOCROSS K2030E, EPOCROSS WS-500 and EPOCROSS WS-700 (trade names, all manufactured by Nippon Shokubai Co., Ltd.) can also be used.

Specific examples of the carbodiimide crosslinking agent include dicyclohexylmethane carbodiimide, tetramethylxylylene carbodiimide, and the like. The carbodiimide compounds described in JP-A No. 2009-235278 are also preferable. Commercially available carbodiimide crosslinking agents may also be used which include CARBODILITE SV-02, CARBODILITE V-02, CARBODILITE V-02-L2, CARBODILITE V-04, CARBODILITE E-01, and CARBODILITE E-02 (trade names, manufactured by Nisshinbo Chemical, Inc.)

In the polymer layer, a mass content of the structural portion derived from the crosslinking agent is preferably from 1% by mass to 30% by mass, and more preferably from 5% by mass to 20% by mass based on the content of the composite polymer. When the mass content is 1% by mass or more, the polymer layer is excellent in strength and adhesiveness over time in the presence of moisture and heat. When the mass content is 30% by mass or less, the pot life of the coating liquid can be maintained long.

In the back sheet of the invention, since the polymer layer contains a composite polymer such as described above, the polymer layer has improved adhesion to the polymer base material, and improved interlayer adhesiveness (in particular, adhesiveness to a sealing material of the cell-side substrate). Further, the polymer layer is excellent in the resistance to deterioration (adhesion durability) in a hot and humid environment. Therefore, it is preferable to provide the polymer layer as the outermost layer that is disposed at the farthest position from the polymer base material. Specific examples include a back layer which is disposed on the opposite side (rear side) of the side facing the cell-side substrate including a solar cell device (front side), and a reflective layer with light reflectivity, which is disposed to be in contact with a sealing material that seals a solar cell device of a cell-side substrate.

Only one polymer layer may be provided, or plural polymer layers may be provided.

The thickness of one polymer layer is preferably from 0.3 μm to 22 μm, more preferably from 0.5 μm to 15 μm, further preferably from 0.8 μm to 12 μm, particularly preferably from 1.0 μm to 8 μm, and most preferably from 2 μm to 6 μm. When the thickness of the polymer layer is 0.3 μm or more, or 0.8 μm or more, water hardly penetrates through the polymer layer when exposed to a hot and humid environment, and thus water hardly reaches the interface between the polymer layer and the polymer base material, so that the adhesiveness is significantly improved. When the thickness of the polymer layer is 22 μm or less, or 12 μm or less, the polymer layer hardly becomes brittle, and destruction of the polymer layer when exposed to a hot and humid environment hardly occurs, so that the adhesiveness is improved.

The effect of improving the adhesiveness over time in a hot and humid environment is excellent particularly when the polymer layer includes the composite polymer and a crosslinked structure in which polymer molecules of the composite polymer are crosslinked by the crosslinking agent, wherein a mass content of the structural portion derived from the crosslinking agent is from 1% by mass to 30% by mass based on the content of the composite polymer, and the thickness of the polymer layer is from 0.8 μm to 12 μm.

—Back Layer—

When the polymer layer according to the invention is constructed as a back layer, the back layer may optionally further include, in addition to the composite polymer, other components such as various additives. In a solar cell having a laminated structure of cell-side substrate (=transparent substrate (glass substrate or the like) on the sunlight-incident side/solar cell device)/back sheet for a solar cell, the back layer is a rear surface protective layer which is disposed on the opposite side of the side facing the cell-side substrate of the polymer base material, which is a support, and the back layer may have a single layer structure, or may have a structure with two or more layers laminated therein. Since the back layer contains a composite polymer, the adhesion to the polymer base material or the interlayer adhesion in the case where the back layer is composed of two or more layers can be improved, and at the same time, resistance to deterioration in a hot and humid environment is obtained. Therefore, an embodiment in which the back layer as the polymer layer according to the invention is disposed as the outermost layer that is the most distant from the polymer base material, is preferable.

When at least two back layers are provided, the back layers may be polymer layers each including the composite polymer or both the composite polymer and the crosslinking agent, or one of the back layers may be a polymer layer including the composite polymer or both the composite polymer and the crosslinking agent.

In particular, from the viewpoint of improving adhesion durability in a hot and humid environment, it is preferable that at least the back layer contacting the polymer base material (first back layer) is a polymer layer including the composite polymer or both the composite polymer and the crosslinking agent. In this case, the second back layer provided on the first back layer on the polymer base material may not include the composite polymer including (poly) siloxane structural units represented by formula (1) and non-siloxane structural units. In this case, from the viewpoint of forming a uniform film without gaps consisting only of resin to prevent water penetration through gaps between the polymer and the pigment and improve the adhesiveness in a hot and humid environment, it is preferable that the second back layer does not contain a polysiloxane homopolymer.

Examples of the other components that can be contained in the back layer include a surfactant, and a filler, as will be described later. Furthermore, pigments that are used in a colored layer may also be incorporated. The details and preferable embodiments of these other components and pigments will be described below.

—Colored Layer—

When the polymer layer according to the invention is constructed as a colored layer (preferably, a reflective layer), the polymer layer may further contain a pigment, in addition to the composite polymer. The colored layer may optionally further include other components such as various additives.

Examples of the functions of the colored layer include, as a first function, increasing the power generation efficiency of a solar cell module by reflecting the portion of light that has passed through the solar cell device and has reached to the back sheet without being used in power generation, in the incident light, to return the portion of light to the solar cell device; and as a second function, enhancing the decorativeness of the external appearance when the solar cell module is viewed from the sunlight incident side (front surface side). In general, when a solar cell module is viewed from the front surface side, a back sheet is seen around the solar cell. Therefore, when a colored layer is provided on the back sheet, decorativeness can be enhanced, and thereby the appearance can be improved.

(Pigment)

The colored layer according to the invention can contain at least one pigment.

Examples of the pigment include inorganic pigments such as titanium dioxide, barium sulfate, silicon oxide, aluminum oxide, magnesium oxide, calcium carbonate, kaolin, talc, ultramarine blue, Prussian blue, and carbon black; and organic pigments such as phthalocyanine blue and phthalocyanine green, and the pigment can be appropriately selected and incorporated.

Among the pigment, in the case of constructing the polymer layer as a reflective layer which reflects the portion of light that enters the solar cell and passes through the solar cell, and returns the portion of light to the solar cell, a white pigment is preferable. Preferable examples of the white pigment include titanium dioxide, barium sulfate, silicon oxide, aluminum oxide, magnesium oxide, calcium carbonate, kaolin and talc.

The content of the pigment in the colored layer is preferably in the range of 2.5 g/m$^2$ to 8.5 g/m$^2$. When the content of the pigment is 2.5 g/m$^2$ or greater, necessary coloration is achieved, and a reflection ratio and decorativeness can be effectively provided. When the content of the pigment in the colored layer is 8.5 g/m$^2$ or less, the surface state of the colored layer is likely to be maintained satisfactorily, and the film strength is superior. Among others, the content of the pigment is more preferably in the range of 4.5 g/m$^2$ to 8.0 g/m$^2$.

The average particle diameter of the pigment is preferably 0.03 μm to 0.8 μm, and more preferably about 0.15 μm to 0.5 μm, as a volume average particle diameter. When the average particle diameter is in the range mentioned above, the light reflection efficiency is high. The average particle diameter is a value measured with a laser analysis/scattering type particle diameter distribution analyzer [LA950, trade name, manufactured by Horiba, Ltd.].

When the polymer layer is constructed as a colored layer, the content of the binder component (including the composite polymer described above) is preferably in the range of 15% by mass to 200% by mass, and more preferably in the range of 17% by mass to 100% by mass, based on the content of the pigment. When the content of the binder is 15% by mass or greater, sufficient strength of the colored layer is obtained, and when the content is 200% by mass or less, the reflection ratio or decorativeness can be satisfactorily maintained.

(Additives)

The polymer layer of the invention may optionally contain a surfactant, a filler and the like.

As the surfactant, known surfactants of anionic type or nonionic type can be used. When a surfactant is added, the amount of addition of the surfactant is preferably 0.1 mg/m$^2$ to 15 mg/m$^2$, and more preferably 0.5 mg/m$^2$ to 5 mg/m$^2$. When the amount of addition of the surfactant is 0.1 mg/m$^2$ or greater, the occurrence of cissing is suppressed, and satisfactory layer formation may be achieved. When the amount of addition is 15 mg/m$^2$ or less, adhesion can be satisfactorily carried out.

The polymer layer according to the invention may further contain a filler. The amount of addition of the filler is preferably 20% by mass or less, and more preferably 15% by mass or less, based on the content of the binder of the polymer layer. When the amount of addition of the filler is 20% by mass or less, the surface state of the polymer layer can be maintained to be more satisfactory.

—Properties—

When a colored layer is used as reflective layer by adding a white pigment as a pigment, the light reflection ratio at 550 nm at the surface on the side where the colored layer and an easy adhesion layer are provided, is preferably 75% or higher. The light reflection ratio is a ratio of the amount of light that enters through the surface of the easy adhesion layer, is reflected at the reflective layer, and exits again through the easy adhesion layer, to the amount of incident light. Here, a light having a wavelength of 550 nm is used as a light with the representative wavelength.

When the light reflection ratio is 75% or higher, the portion of light that has just passed through the cell and enters into inside, can be effectively returned to the cell, and therefore, the effect of enhancing the power generation efficiency is large. When the content of the colorant is controlled in the range of 2.5 g/m$^2$ to 30 g/m$^2$, the light reflection ratio can be adjusted to be 75% or higher.

The back sheet for a solar cell of the invention has other functional layers in addition to the polymer base material and the polymer layer. As other functional layers, an undercoat layer and an easy adhesion layer may be provided.

—Undercoat Layer—

In the back sheet for a solar cell of the invention, an undercoat layer may be provided between the polymer base material (support) and the polymer layer. The thickness of the undercoat layer is preferably in the range of 2 μm or less, more preferably 0.05 µm to 2 µm, and even more preferably 0.1 µm to 1.5 µm. When the thickness is 2 µm or less, the surface state can be maintained to be satisfactory. Furthermore, when the thickness is 0.05 µm or greater, necessary adhesiveness is likely to be secured.

The undercoat layer can contain a binder. Examples of the binder include polyester, polyurethane, acrylic resins, and polyolefin. Furthermore, in addition to the binder, an epoxy, isocyanate, melamine, carbodiimide or oxazoline crosslinking agent, an anionic or nonionic surfactant, a filler such as silica may also be added to the undercoat layer.

There are no particular limitations on the method for applying the undercoat layer, or on the solvent of the coating liquid.

As the method of application, for example, a gravure coater or a bar coater can be used.

The solvent used in the coating liquid may be water, or may be an organic solvent such as toluene or methyl ethyl ketone. A single kind of the solvent may be used alone, or two or more kinds may be used in mixture.

Furthermore, application may be carried out by a method of applying the coating liquid on a polymer base material that has been biaxially stretched, or a method of applying the coating liquid on a polymer base material that has been uniaxially stretched, and then stretching the polymer base material in the direction different from the direction of the initial stretching. Moreover, the coating liquid may be applied on a base material before stretching, and then the base material may be stretched biaxially.

The back sheet for a solar cell of the invention may be produced by an appropriately selected method comprising forming a polymer layer containing the specific composite polymer (a composite polymer that contains siloxane structural units represented by formula (1) and non-siloxane structural units). For example, the formation of the polymer layer may be most preferably carried out by the method for producing a back sheet for a solar cell of the invention described below.

—Colored Layer—

The back sheet of the invention may be provided with a colored layer (preferably, a reflective layer) which substantially does not contain the composite polymer. In this case, the back sheet can be suitably constructed by providing a polymer layer containing a composite polymer between the colored layer (particularly, a reflective layer) and the polymer base material. The colored layer in this case contains at least a polymer component other than the composite polymer, and a pigment, and optionally can further contain other components such as various additives.

The details of the pigment and the various additives are as described above in connection with the case where the polymer layer is formed as a colored layer. There are no particular limitations on the polymer component other than the composite polymer, and the polymer component can be appropriately selected in accordance with the purpose.

The phrase "substantially does not contain" means that the colored layer does not contain the composite polymer in an active manner, and specifically means that the content of the composite polymer in the colored layer is 15% by mass or less. Preferably, if the colored layer does not contain the composite polymer (the content is 0% by mass), it is preferable.

When a reflective layer is provided on the polymer base material, the invention is not limited to an embodiment in which the reflective layer contains the composite polymer as described above, and an embodiment in which one layer or two or more layers of polymer layers are provided between a reflective layer which substantially does not contain the composite polymer and the polymer base material, may also be adopted. In this case, when a polymer layer containing the composite polymer is provided between the polymer base material and the colored layer, adhesiveness and close adherence between the reflective layer and the polymer base material are enhanced, and water resistance can be further increased. Thereby, deterioration of weather resistance which is attributed to poor adhesion is prevented.

—Easy Adhesion Layer—

The back sheet of the invention may be further provided with an easy adhesion layer over the polymer layer (particularly, reflective layer). The easy adhesion layer is a layer intended to firmly adhere the back sheet to the sealing material that seals the solar cell device (hereinafter, also referred to as power generating device) of the cell-side substrate (the main body of the cell).

The easy adhesion layer can contain a binder and inorganic fine particles, and optionally may further include other components such as additives. The easy adhesion layer preferably has an adhesive power of 10 N/cm or greater (preferably, 20 N/cm or greater) with respect to the ethylene-vinyl acetate (EVA; ethylene-vinyl acetate copolymer) sealing material that seals the power generating device of the cell-side substrate. When the adhesive power is 10 N/cm or greater, the resistance to moisture and heat that can maintain adhesiveness, is likely to be obtained.

The adhesive power can be adjusted by a method of regulating the amounts of the binder and the inorganic fine particles in the easy adhesion layer, a method of applying a corona treatment to the surface which adheres to the sealing material of the back sheet, or the like.

(Binder)

The easy adhesion layer can contain at least one binder.

Examples of a binder suitable for the easy adhesion layer include polyester, polyurethane, acrylic resins and polyolefin. Among them, from the viewpoints of durability, acrylic resins and polyolefin are preferred. Furthermore, a composite resin of acryl and silicone is also preferable as an acrylic resin.

Preferable examples of the binder include, as specific examples of the polyolefin, CHEMIPEARL S-120 and S-75N (trade names, all manufactured by Mitsui Chemicals, Inc.); as specific examples of the acrylic resins, JURYMER ET-410 and SEK-301 (trade names, all manufactured by Nihon Junyaku Co., Ltd.); as specific examples of the composite resin of acryl and silicone, CERANATE WSA1060 and WSA1070 (trade names, all manufactured by DIC Corp.), and H7620, H7630 and H7650 (trade names, all manufactured by Asahi Kasei Chemicals Corp.).

The content of the binder in the easy adhesion layer is preferably in the range of 0.05 $g/m^2$ to 5 $g/m^2$. Among others, the content is more preferably in the range of 0.08 $g/m^2$ to 3 $g/m^2$. When the content of the binder is 0.05 $g/m^2$ or greater, the desired adhesive power is likely to be obtained, and when the content is 5 $g/m^2$, or less, a more satisfactory surface state is obtained.

(Fine Particles)

The easy adhesion layer can contain at least one kind of inorganic fine particles.

Examples of the inorganic fine particles include fine particles of silica, calcium carbonate, magnesium oxide, magnesium carbonate, and tin oxide. Among them, fine particles of tin oxide and silica are preferable from the viewpoints that the decrease in the adhesiveness, when exposed to a hot and humid atmosphere, is small.

The particle diameter of the inorganic fine particles is preferably about 10 nm to 700 nm, and more preferably about 20 nm to 300 nm, as a volume average particle diameter. When the particle diameter is in this range, easy adhesiveness that is more satisfactory is obtained. The particle diameter is a value measured by a laser analysis/scattering type particle diameter distribution analyzer [LA950, trade name, manufactured by Horiba, Ltd.].

There are no particular limitations on the shape of the inorganic fine particles, and any of a spherical shape, an amorphous shape, a needle-like shape and the like can be used.

The content of the inorganic fine particles may be in the range of 5% by mass to 400% by mass based on the content of the binder in the easy adhesion layer. If the content of the inorganic fine particles is less than 5% by mass, satisfactory adhesiveness may not be maintained when exposed to a hot and humid atmosphere, and if the content exceeds 400% by mass, the surface state of the easy adhesion layer may be deteriorated.

Inter alia, the content of the inorganic fine particles is preferably in the range of 50% by mass to 300% by mass.

(Crosslinking Agent)

The easy adhesion layer can contain at least one crosslinking agent.

Examples of the crosslinking agent which is suitable for the easy adhesion layer include epoxy, isocyanate, melamine, carbodiimide and oxazoline crosslinking agents. Among them, from the viewpoints of securing adhesiveness over time in the presence of moisture and heat, oxazoline crosslinking agents are particularly preferable. Specific examples of the oxazoline crosslinking agents include those described in the above section of the polymer layer.

The content of the crosslinking agent in the easy adhesion layer is preferably 5% to 50% by mass, and among others, more preferably 20% to 40% by mass, based on the content of the binder in the easy adhesion layer. When the content of the crosslinking agent is 5% by mass or greater, satisfactory crosslinking effects are obtained, and the strength or adhesiveness of the colored layer can be maintained. When the content is 50% by mass or less, the pot life of the coating liquid can be maintained long.

(Additive)

In the easy adhesion layer according to the invention, known matting agents such as polystyrene, polymethyl methacrylate and silica, known surfactants of anionic type or nonionic type, and the like may be further added optionally.

(Method for Forming Easy Adhesion Layer)

The formation of the easy adhesion layer may be carried out by a method of affixing a polymer sheet having easy adhesiveness on the base material, or a method of coating. Among them, the method of coating is preferable from the viewpoints that the method is convenient, and formation of a uniform thin film is possible. As the coating method, for example, known coating methods using a gravure coater or a bar coater can be used. The coating solvent used in the preparation of the coating liquid may be water, or may be an organic solvent such as toluene or methyl ethyl ketone. A single kind of coating solvent may be used alone, or two or more kinds may be used in mixture.

There are no particularly limitations on the thickness of the easy adhesion layer, but the thickness is usually preferably 0.05 µm to 8 µm, and more preferably in the range of 0.1 µm to 5 µm. When the thickness of the easy adhesion layer is 0.05 µm or greater, necessary easy adhesiveness may be suitably obtained, and when the thickness is 8 µm or less, the surface state is improved.

Furthermore, the easy adhesion layer of the invention needs to be transparent, in order not to reduce the effects of the colored layer.

—Properties—

The back sheet for a solar cell of the invention is preferably such that the adhesive power to the sealing material after storage for 48 hours in an atmosphere of 120° C. and 100% RH is 75% or greater relative to the adhesive power to the sealing material before storage. When the back sheet for a solar cell of the invention contains, as described above, a predetermined amount of a binder, and inorganic fine particles in a predetermined amount with respect to the binder, and the back sheet has an easy adhesion layer having an adhesive power of 10 N/cm or greater to an EVA sealing material, even after a storage as described above, an adhesive power of 75% or greater compared to the adhesive power before storage can be obtained. Thereby, a solar cell module thus produced is such that peeling of the back sheet, and a consequent decrease in the power generation performance, are suppressed, and long-term durability is more enhanced.

—Production of Back Sheet—

The back sheet for a solar cell of the invention may be produced by any method, so long as the method is a method capable of forming the polymer layer according to the invention, and optionally an easy adhesion layer, on a polymer base material, as described above. According to the invention, the back sheet can be suitably produced by a method including a step of applying a coating liquid containing a composite polymer that contains, in a molecule, 15% by mass to 85% by mass of siloxane structural units represented by the above formula (1) and 85% by mass to 15% by mass of non-siloxane structural units, and preferably a crosslinking agent (and optionally, a coating liquid for easy adhesion layer) on a polymer base material, thereby forming at least one polymer layer (the method for producing a back sheet for a solar cell of the invention).

The coating liquid for polymer layer is a coating liquid containing at least a composite polymer, as described above. The details of the polymer base material, and the composite polymer and other components that constitute the various coating liquids are as described above.

Suitable examples of the coating method are also as described above, and for example, a gravure coater or a bar coater can be used. Furthermore, in the coating step according to the invention, the polymer layer (for example, a colored layer (preferably, a reflective layer) or a back layer) can be formed on a polymer base material by applying a coating liquid for polymer layer directly, or via an undercoat layer having a thickness of 2 µm or less, on the surface of the polymer base material.

The formation of the polymer layer can be carried out by a method of affixing a polymer sheet on the polymer base material, a method of co-extruding the polymer layer during the formation of the polymer base material, a method involving coating, or the like. Among them, the method involving coating is preferable from the viewpoints that the method is convenient, and is also capable of forming a thin film uniformly. In the case of forming the polymer layer by coating, as the method of applying the coating liquid, for example, a known coating method of using a gravure coater or a bar coater can be used.

The coating liquid may be an aqueous system using water as the coating solvent, or a solvent system using an organic solvent such as toluene or methyl ethyl ketone. Among them, it is preferable to use water as the solvent, from the viewpoints of environmental burden. A single kind of the coating solvent may be used alone, or two or more kinds may be used in mixture.

The coating liquid for polymer layer is preferably an aqueous coating liquid in which 50% by mass or more, and preferably 60% by mass or more, of the solvent contained in this is water. An aqueous coating liquid is preferable from the viewpoints of environmental burden, and when the proportion of water is 50% by mass or greater, it is advantageous since environmental burden is particularly reduced. A larger proportion of water in the coating liquid for polymer layer is preferable from the viewpoints of environmental burden, and it is more preferable that water is 90% by mass or more of the total amount of the solvent.

After the coating step, a drying step may be provided in which drying is carried out under desired conditions.

<Solar Cell Module>

The solar cell module of the invention includes the above back sheet for a solar cell of the invention or a back sheet for a solar cell produced by the above method for producing a back sheet for a solar cell of the invention. In a preferable embodiment of the invention, the solar cell module is constituted such that a solar cell device that converts the light energy of sunlight to electrical energy, is disposed between a transparent front substrate through which sunlight enters, and the back sheet for a solar cell of the invention as described above, and the solar cell device is sealed and adhered with a sealing material such as an ethylene-vinyl acetate sealing material, between the front substrate and the back sheet. That is, a cell structural portion which comprises a solar cell device and a sealing material that seals the solar cell device is provided between the front substrate and the back sheet.

Other members except solar cell module, solar cell and back sheet are described in detail in, for example, "Constituent Materials for Photovoltaic Power Generation System" (edited by Eiichi Sugimoto, Kogyo Chosakai Publishing Co., published in 2008).

The transparent substrate may desirably have light transmitting properties by which sunlight can be transmitted, and can be appropriately selected from base materials that transmit light. From the viewpoints of power generation efficiency, a base material having higher light transmittance is preferable, and as such a substrate, for example, a glass substrate, a substrate of a transparent resin such as an acrylic resin, and the like can be suitably used.

As the solar cell device, various known solar cell devices of silicon materials such as single-crystal silicon, polycrystal silicon and amorphous silicon; Group III-V or Group II-VI compound semiconductors such as copper-indium-gallium-selenium, copper-indium-selenium, cadmium-tellurium and gallium-arsenic; and the like can be applied.

EXAMPLES

Hereinafter, the invention will be more specifically described by way of Examples, but the invention is not intended to be limited to the following Examples. In addition, the unit "parts" in the Examples is on a mass basis.

In the following descriptions, the volume average particle diameter was measured using a laser analysis/scattering type particle diameter distribution analyzer [LA950, trade name, manufactured by Horiba, Ltd.].

Synthesis of Composite Polymer

Synthesis Example-1

Preparation of Aqueous Dispersion of Composite Polymer P-1

—Step 1—

In a reaction vessel equipped with a stirring device and a dropping funnel and substituted with nitrogen gas, 81 parts of propylene glycol mono-n-propyl ether (PNP), 360 parts of isopropyl alcohol (IPA), 110 parts of phenyltrimethoxysilane (PTMS), and 71 parts of dimethyldimethoxysilane (DMDMS) were introduced, and while the mixture was stirred in a nitrogen gas atmosphere, the temperature was raised to 80° C.

—Step 2—

Subsequently, a mixture containing 260 parts of methyl methacrylate (MMA), 200 parts of n-butyl methacrylate (BMA), 110 parts of n-butyl acrylate (BA), 30 parts of acrylic acid (AA), 19 parts of 3-methacryloyloxypropyltrimethoxysilane (MPTMS), 31.5 parts of tert-butyl peroxy-2-ethylhexanoate (TBPO), and 31.5 parts of PNP was added dropwise over 4 hours into the reaction vessel at the same temperature. Thereafter, the mixture was heated and stirred for 2.5 hours at the same temperature, and thus a solution of an acrylic polymer containing a carboxyl group and a hydrolyzable silyl group and having a weight average molecular weight of 29,300 was obtained.

—Step 3—

Subsequently, 54.8 parts of deionized water was added thereto, and the mixture was continuously heated under stirring for 16 hours to thereby hydrolyze the alkoxysilane and condense the product with the acrylic polymer. Thus, a solution of a composite polymer having a moiety derived from a carboxy group-containing acrylic polymer and a polysiloxane moiety, having a non-volatile component (NV) of 56.3% by mass and a solution acid value of 22.3 mg KOH/g, was obtained.

—Step 4—

Subsequently, 42 parts of triethylamine was added to this solution at the same temperature under stirring, and the mixture was stirred for 10 minutes. Thereby, 100% of the carboxy groups contained were neutralized.

—Step 5—

Thereafter, 1250.0 parts of deionized water was added dropwise over 1.5 hours at the same temperature to achieve phase inversion emulsification, subsequently the temperature was raised to 50° C., and the mixture was stirred for 30 minutes. Subsequently, a portion of water was removed, together with the organic solvent, under reduced pressure over 3.5 hours at an internal temperature of 40° C. Thereby, an aqueous dispersion of composite polymer P-1 containing a moiety derived from a carboxy group-containing acrylic polymer and a polysiloxane moiety, having a solid concentration of 42% by mass and an average particle diameter of 110 nm, was obtained. The aqueous dispersion P-1 contained about 25% by mass of the polysiloxane moiety and about 75% by mass of the acrylic polymer moiety in the polymer.

Synthesis Example-2

Preparation of Aqueous Dispersion of Composite Polymer P-2

An aqueous dispersion of composite polymer P-2 was prepared in the same manner as in the Synthesis Example-1, except that the amounts of monomers used in the preparation of the aqueous dispersion of composite polymer P-1 were changed to the following amounts.

The proportions of the monomers used were as follows: Phenyltrimethoxysilane (PTMS): 210 parts, dimethyldimethoxysilane (DMDMS): 166 parts, 3-methacryloyloxypropyltrimethoxysilane (MPTMS): 24 parts, methyl methacrylate (MMA): 200 parts, n-butyl methacrylate (BMA): 100 parts, n-butyl acrylate (BA): 70 parts, and acrylic acid (AA): 30 parts. The aqueous dispersion P-2 contained about 50% by mass of the polysiloxane moiety and about 50% by mass of the acrylic polymer moiety in the polymer.

Synthesis Example-3

Preparation of Aqueous Dispersion of Composite Polymer P-3

An aqueous dispersion of composite polymer P-3 was prepared in the same manner as in the Synthesis Example-1, except that the amounts of monomers used in the preparation of the aqueous dispersion of composite polymer P-1 were changed to the following amounts.

The proportions of the monomers used were as follows: Phenyltrimethoxysilane (PTMS): 320 parts, dimethyldimethoxysilane (DMDMS): 244 parts, 3-methacryloyloxypropyltrimethoxysilane (MPTMS): 36 parts, methyl methacrylate (MMA): 90 parts, n-butyl methacrylate (BMA): 60 parts, n-butyl acrylate (BA): 20 parts, and acrylic acid (AA): 30 parts. The aqueous dispersion P-3 contained about 75% by mass of the polysiloxane moiety and about 25% by mass of the acrylic polymer moiety in the polymer.

Synthesis Example-4

Preparation of Aqueous Dispersion of Composite Polymer P-4

An aqueous dispersion of composite polymer P-4 was prepared in the same manner as in the Synthesis Example-1, except that the amounts of monomers used in the preparation of the aqueous dispersion of composite polymer P-1 were changed to the following amounts.

The proportions of the monomers used were as follows: Phenyltrimethoxysilane (PTMS): 60 parts, dimethyldimethoxysilane (DMDMS): 25 parts, 3-methacryloyloxypropyltrimethoxysilane (MPTMS): 15 parts, methyl methacrylate (MMA): 300 parts, n-butyl methacrylate (BMA): 220 parts, n-butyl acrylate (BA): 150 parts, and acrylic acid (AA): 30 parts. The aqueous dispersion P-4 contained about 13% by mass of the polysiloxane moiety in the polymer, and this is a polymer which is not classified as the composite polymer according to the invention.

Synthesis Example-5

Preparation of Aqueous Dispersion of Composite Polymer P-5

An aqueous dispersion of composite polymer P-5 was prepared in the same manner as in the Synthesis Example-1, except that the amounts of monomers used in the preparation of the aqueous dispersion of composite polymer P-1 were changed to the following amounts.

The proportions of the monomers used were as follows: Phenyltrimethoxysilane (PTMS): 360 parts, dimethyldimethoxysilane (DMDMS): 320 parts, 3-methacryloyloxypropyltrimethoxysilane (MPTMS): 40 parts, methyl methacrylate (MMA): 20 parts, n-butyl methacrylate (BMA): 20 parts, n-butyl acrylate (BA): 10 parts, and acrylic acid (AA): 30 parts. The aqueous dispersion P-5 contained about 90% by mass of the polysiloxane moiety in the polymer, and this is a polymer which is not classified as the composite polymer according to the invention. Furthermore, aggregation occurred in this aqueous dispersion, and the stability was poor.

Synthesis Example-6

Preparation of Aqueous Dispersion of Composite Polymer P-6

An aqueous dispersion of composite polymer P-6 was prepared in the same manner as in the preparation of the aqueous dispersion of composite polymer P-1, except that 110 parts of phenyltrimethoxysilane (PTMS) and 71 parts of dimethyldimethoxysilane (DMDMS) that were initially added during the preparation of the aqueous dispersion of composite polymer P-1, were changed to 100 parts of phenyltrimethoxysilane (PTMS), 10 parts of 3-aminopropyltriethoxysilane (APTES) and 71 parts of dimethyldimethoxysilane (DMDMS).

The aqueous dispersion P-6 contained about 25% by mass of the polysiloxane moiety and about 75% by mass of the acrylic polymer moiety in the polymer.

Synthesis Example-7

Preparation of Aqueous Dispersion of Composite Polymer P-7

An aqueous dispersion of composite polymer P-7 was prepared in the same manner as in the preparation of the aqueous dispersion of composite polymer P-6, except that 10 parts of 3-aminopropyltriethoxysilane (APTES) used in the preparation of the aqueous dispersion of composite polymer P-6 was changed to 10 parts of 3-mercaptopropyltrimethoxysilane (MPTMS).

The aqueous dispersion P-7 contained about 25% by mass of the polysiloxane moiety and about 75% by mass of the acrylic polymer moiety in the polymer.

Synthesis Example-8

Preparation of Aqueous Dispersion of Composite Polymer P-8

An aqueous dispersion of composite polymer P-8 was prepared in the same manner as in the preparation of the aqueous dispersion of composite polymer P-6, except that 10 parts of 3-aminopropyltriethoxysilane (APTES) used in the preparation of the aqueous dispersion of composite polymer P-6 was changed to 10 parts of 3-glycidoxypropyltrimethoxysilane (GPTMS).

The aqueous dispersion P-8 contained about 25% by mass of the polysiloxane moiety and about 75% by mass of the acrylic polymer moiety in the polymer.

Synthesis Example-9

Preparation of Aqueous Dispersion of Composite Polymer P-9

An aqueous dispersion of composite polymer P-9 was prepared in the same manner as in the preparation of the aqueous dispersion of composite polymer P-6, except that 10 parts of 3-aminopropyltriethoxysilane (APTES) used in the preparation of the aqueous dispersion of composite polymer P-6 was changed to 10 parts of p-styryltrimethoxysilane (STMS).

The aqueous dispersion P-9 contained about 25% by mass of the polysiloxane moiety and about 75% by mass of the acrylic polymer moiety in the polymer.

Types and amounts of the materials used in the preparation of composite polymer aqueous dispersions P-1 to P-9 are shown in the following Table 1.

tion reaction product had been transferred, in an amount of 0.3% by mass based on the resulting polymer. After stirring for 5 minutes, ethylene glycol solutions of cobalt acetate and manganese acetate were added thereto, such that the concentration of cobalt element and the concentration of manganese element in the polymer thus obtainable were 30 ppm and 15 ppm, respectively. After further stirring for 5 minutes, a 2 mass % ethylene glycol solution of a titanium alkoxide compound was added such that the concentration of titanium element in the polymer thus obtainable was 5 ppm. After 5 minutes, a 10 mass % ethylene glycol solution of ethyl diethylphosphonoacetate was added to provide a concentration of P element of 5 ppm based on the polymer thus obtainable. Thereafter, while the oligomer was stirred at 30 rpm, the reaction system was slowly heated from 250° C. to 285° C., and the pressure was decreased to 40 Pa. The time taken to reach the final temperature and the final pressure was adjusted to 60 minutes. At the time point when

TABLE 1

| | Type of material | Synthesis Example 1 P-1 | Synthesis Example 2 P-2 | Synthesis Example 3 P-3 | Synthesis Example 4 P-4 | Synthesis Example 5 P-5 | Synthesis Example 6 P-6 | Synthesis Example 7 P-7 | Synthesis Example 8 P-8 | Synthesis Example 9 P-9 |
|---|---|---|---|---|---|---|---|---|---|---|
| [Step 1] | PNP | 81 | 81 | 81 | 81 | 81 | 81 | 81 | 81 | 81 |
| | IPA | 360 | 360 | 360 | 360 | 360 | 360 | 360 | 360 | 360 |
| | PTMS | 110 | 210 | 320 | 60 | 360 | 100 | 100 | 100 | 100 |
| | DMDMS | 71 | 166 | 244 | 25 | 320 | 71 | 71 | 71 | 71 |
| | APTES | | | | | | 10 | | | |
| | MPTMS | | | | | | | 10 | | |
| | GPTMS | | | | | | | | 10 | |
| | STMS | | | | | | | | | 10 |
| [Step 2] | MMA | 260 | 200 | 90 | 300 | 20 | 260 | 260 | 260 | 260 |
| | BMA | 200 | 100 | 60 | 220 | 20 | 200 | 200 | 200 | 200 |
| | BA | 110 | 70 | 20 | 150 | 10 | 110 | 110 | 110 | 110 |
| | AA | 30 | 30 | 30 | 30 | 30 | 30 | 30 | 30 | 30 |
| | MPTMS | 19 | 24 | 36 | 15 | 40 | 19 | 19 | 19 | 19 |
| | TBPO | 31.5 | 31.5 | 31.5 | 31.5 | 31.5 | 31.5 | 31.5 | 31.5 | 31.5 |
| | PNP | 31.5 | 31.5 | 31.5 | 31.5 | 31.5 | 31.5 | 31.5 | 31.5 | 31.5 |
| [Step 3] | Deionized water | 54.8 | 54.8 | 54.8 | 54.8 | 54.8 | 54.8 | 54.8 | 54.8 | 54.8 |
| [Step 4] | TEA | 42 | 42 | 42 | 42 | 42 | 42 | 42 | 42 | 42 |
| [Step 5] | Deionized water | 1250 | 1250 | 1250 | 1250 | 1250 | 1250 | 1250 | 1250 | 1250 |
| Molecular composition of composite polymer | Polysiloxane structural units | 25% | 50% | 75% | 13% | 90% | 25% | 25% | 25% | 25% |
| | Acrylic polymer structural units | 75% | 50% | 25% | 87% | 10% | 75% | 75% | 75% | 75% |

In Table 1, numerical values are based on "parts by mass", and % values are based on "% by mass".

Example 1

Production of Polymer Base Material

—Production of PET 1—

[Step 1]—Esterification—

A slurry of 100 kg of high purity terephthalic acid (manufactured by Mitsui Chemicals, Inc.) and 45 kg of ethylene glycol (manufactured by Nippon Shokubai Co., Ltd.) was sequentially supplied over 4 hours to an esterification reaction tank which had been previously charged with about 123 kg of bis(hydroxyethyl) terephthalate and had been maintained at a temperature of 250° C. and a pressure of $1.2 \times 10^5$ Pa, and even after completion of the supply, the esterification reaction was further carried out over one hour. Thereafter, 123 kg of the esterification reaction product thus obtained was transferred to a condensation polymerization reaction tank.

[Step 2]—Production of Polymer Pellets—

Subsequently, ethylene glycol was added to the condensation polymerization reaction tank to which the esterificaa predetermined stirring torque was reached, the reaction system was purged with nitrogen, and the pressure was returned to normal pressure to terminate the condensation polymerization reaction. Then, the polymer was ejected into a strand form into cold water and immediately cut, and thus pellets of the polymer (diameter about 3 mm, length about 7 mm) were produced. Here, the time taken from the initiation of pressure reduction to the time point at which a predetermined stirring torque was reached, was 3 hours.

However, for the titanium alkoxide compound, use was made of the titanium alkoxide compound (Ti content=4.44% by mass) synthesized in Example 1 in paragraph [0083] of JP-A No. 2005-340616.

[Step 3]—Solid Phase Polymerization—

The pellets obtained as described above were maintained in a vacuum container maintained at 40 Pa at a temperature of 220° C. for 30 hours, and thus solid phase polymerization was carried out.

[Step 4]—Production of Polymer Base Material Film—

Pellets after the solid phase polymerization as described above were melted at 280° C. and were cast on a metal drum to produce an unstretched base having a thickness of about 3 mm. Thereafter, the unstretched base was stretched to 3 times in the longitudinal direction at 90° C., and was further stretched to 3.3 times in the transverse direction at 120° C. Thus, a biaxially stretched polyethylene terephthalate support (hereinafter, referred to as "PET-1") having a thickness of 300 μm was obtained.

The carboxy group content in PET-1 was 30 equivalents/t.

<Reflective Layer>

—Preparation of Pigment Dispersion—

The components in the following composition were mixed, and the mixture was subjected to a dispersion treatment for one hour using a Dynomill type dispersing machine.

<Composition of Pigment Dispersion>

| | |
|---|---|
| Titanium dioxide (volume average particle diameter = 0.42 μm) (TIPAQUE R-780-2, trade name, manufactured by Ishihara Sangyo Kaisha, Ltd.; solid content: 100% by mass) | 39.9 mass % |
| Polyvinyl alcohol (PVA-105, trade name, manufactured by Kuraray Co., Ltd.; solid content: 10% by mass) | 8.0 mass % |
| Surfactant (DEMOL EP, trade name, manufactured by Kao Corp.; solid content; 25% by mass) | 0.5 mass % |
| Distilled water | 51.6 mass % |

—Preparation of Coating Liquid for Reflective Layer 1—

The components in the following composition were mixed, and thus a coating liquid for reflective layer 1 was prepared.

<Composition of Coating Liquid 1>

| | |
|---|---|
| Pigment dispersion mentioned above | 80.0 parts |
| Aqueous dispersion liquid of polyacrylic resin (binder: JURYMER ET410, trade name, manufactured by Nihon Junyaku Co., Ltd.; solid content: 30% by mass) | 19.2 parts |
| Polyoxyalkylene alkyl ether (NAROACTY CL95, trade name, manufactured by Sanyo Chemical Industries, Ltd.; solid concentration: 1% by mass) | 3.0 parts |
| Oxazoline compound (crosslinking agent, H-1) (EPOCROS WS-700, trade name, manufactured by Nippon Shokubai Co., Ltd.; solid content: 25% by mass) | 2.0 parts |
| Distilled water | 7.8 parts |

—Formation of Reflective Layer—

The coating liquid for reflective layer 1 thus obtained was applied on the PET-1 described above, and was dried for one minute at 180° C. Thus, a white layer (reflective layer) having an amount of titanium dioxide of 6.5 g/m² was formed as a pigment layer.

<Easy Adhesion Layer>

—Preparation of Coating Liquid for Easy Adhesion Layer—

The components in the following composition were mixed, and thus a coating liquid for easy adhesion layer was prepared.

<Composition of Coating Liquid>

| | |
|---|---|
| Aqueous dispersion liquid of polyolefin resin (Binder: CHEMIPEARL S-75N, trade name, manufactured by Mitsui Chemicals, Inc.; solid content: 24% by mass) | 5.2 parts |
| Polyoxyalkylene alkyl ether (NAROACTY CL95, trade name, manufactured by Sanyo Chemical Industries, Ltd.; solid content: 1% by mass) | 7.8 parts |
| Oxazoline compound (crosslinking agent, H-1) (EPOCROS WS-700, trade name, manufactured by Nippon Shokubai Co., Ltd.; solid content: 25% by mass) | 0.8 parts |
| Aqueous dispersion of silica fine particles (AEROSIL OX-50, trade name, manufactured by Nippon Aerosil Co., Ltd.; volume average particle diameter = 0.15 μm, solid content: 10% by mass) | 2.9 parts |
| Distilled water | 83.3 parts |

—Formation of Easy Adhesion Layer—

The coating liquid thus obtained was applied on the reflective layer to achieve a binder amount of 0.09 g/m², and was dried for one minute at 180° C. Thus, an easy adhesion layer was formed.

<Back Layer>

—Preparation of Coating Liquid for Back Layer 1—

The components in the following composition were mixed, and thus a coating liquid for back layer was prepared.

<Composition for Coating Liquid>

| | |
|---|---|
| Aqueous dispersion of composite polymer P-1 (Solid concentration 42% by mass) | 45.9 parts |
| Oxazoline compound (crosslinking agent, H-1) (EPOCROS WS-700, manufactured by Nippon Shokubai Co., Ltd.; solid content: 25% by mass) | 7.7 parts |
| Polyoxyalkylene alkyl ether (NAROACTY CL95, manufactured by Sanyo Chemical Industries, Ltd.; solid content: 1% by mass) | 2.0 parts |
| Distilled water | 44.4 parts |

—Formation of Back Layer—

The coating liquid for back layer 1 thus obtained was applied on the side of the PET-1 where the reflective layer and the easy adhesion layer were not formed, such that the binder amount was 3.0 g/m² as a wet coating amount, and the coating liquid was dried for one minute at 180° C. Thus, a back layer having a dry thickness of 3 μm was formed.

As described above, a back sheet was produced.

Examples 2 and 3, and Comparative Examples 1 and 2

Back sheets were produced in the same manner as in Example 1, except that the aqueous dispersion of composite polymer P-1 used in the preparation of the coating liquid for back layer in Example 1 was replaced with the aqueous dispersions of composite polymer P-2 and P-3 (solid concentration 42% by mass; Examples 2 and 3) and the aqueous dispersions of composite polymer P-4 and P-5 (solid concentration 42% by mass; Comparative Examples 1 and 2) prepared as described above, respectively.

Example 4

A back sheet was produced in the same manner as in Example 1, except that the following coating liquid for back layer 2 was prepared by replacing the aqueous dispersion of composite polymer P-1 used in the preparation of the coating liquid for back layer in Example 1, with the aqueous dispersion of composite polymer P-6 (solid concentration 42% by mass) prepared as described above, and the coating liquid for back layer 2 was used instead of the coating liquid for back layer 1.

—Preparation of Coating Liquid for Back Layer 2—

The components in the following composition were mixed, and thus a coating liquid for back layer 2 was prepared.

<Composition of Coating Liquid>

| | |
|---|---|
| Aqueous dispersion of composite polymer P-6 (Solid concentration 42% by mass) | 45.9 parts |
| Epoxy compound (crosslinking agent, H-2) (DINACOL EX521, trade name, manufactured by Nagase Chemtex Corp.; solid content: 25% by mass) | 7.7 parts |
| Polyoxyalkylene alkyl ether (NAROACTY CL95, trade name, manufactured by Sanyo Chemical Industries, Ltd.; solid content: 1% by mass) | 2.0 parts |
| Distilled water | 44.4 parts |

Example 5

A back sheet was produced in the same manner as in Example 1, except that the following coating liquid for back layer 3 was prepared by replacing the aqueous dispersion of composite polymer P-1 used in the preparation of the coating liquid for back layer in Example 1, with an aqueous dispersion of composite polymer P-7 (solid concentration 42% by mass), and the coating liquid for back layer 3 was used instead of the coating liquid for back layer 1.

—Preparation of Coating Liquid for Back Layer 3—

The components in the following composition were mixed, and thus a coating liquid for back layer 3 was prepared.

<Composition of Coating Liquid>

| | |
|---|---|
| Aqueous dispersion of composite polymer P-7 (Solid concentration 40% by mass) | 48.2 parts |
| Carbodiimide compound (crosslinking agent, H-3) (CARBODILITE V-02-L2, trade name, manufactured by Nisshinbo Chemical, Inc.; solid content: 25% by mass) | 7.7 parts |
| Polyoxyalkylene alkyl ether (NAROACTY CL95, trade name, manufactured by Sanyo Chemical Industries, Ltd.; solid content: 1% by mass) | 2.0 parts |
| Distilled water | 42.1 parts |

Examples 6 and 7

Back sheets were produced in the same manner as in Example 1, except that the aqueous dispersion of composite polymer P-1 used in the preparation of the coating liquid for back layer in Example 1 was replaced with an aqueous dispersion of composite polymer P-8 (solid concentration 42% by mass; Example 6) and P-9 (solid concentration 42% by mass; Example 7), respectively, and the dry thickness of the back layer was changed as indicated in the following Table 2 by changing the wet coating amount of the binder.

Examples 8 and 9, and Comparative Examples 3 and 4

Back sheets were produced in the same manner as in Example 1, except that the aqueous dispersion of composite polymer P-1 used in the preparation of the coating liquid for back layer in Example 1 was replaced with the following polymers P-10, P-11, P-101 and P-102 (solid concentration 42% by mass), respectively, and evaluation of the back sheets was performed. The evaluation results are presented in the following Table 2.

P-10: CERANATE WSA1070 (trade name) (Polysiloxane moiety: about 30%, polymer moiety: about 70%, manufactured by DIC Corp.)

P-11: CERANATE WSA1060 (trade name) (Polysiloxane moiety: about 75%, polymer moiety: about 25%, manufactured by DIC Corp.)

P-101: FINETEX ES650 (trade name, manufactured by DIC Corp.)

(Polyester binder that does not have a polysiloxane moiety)

P-102: OLESTAR UD350 (trade name, manufactured by Mitsui Chemicals, Inc.)

(Polyurethane binder that does not have a polysiloxane moiety)

Examples 10 and 11

Back sheets were produced in the same manner as in Examples 6 and 7, except that the melting temperature used for the production of PET-1 in [Step 4] in Examples 6 and 7 was increased from 280° C. to 295° C. (PET-2: Example 10) and 310° C. (PET-3: Example 11), respectively, and the dry thickness of the back layer was changed as indicated in the following Table 2 by changing the wet coating amount of the binder.

Example 12

A back sheet was produced in the same manner as in Example 1, except that the oxazoline compound (crosslinking agent, H-1) was not added in Example 1.

Example 13

A back sheet was produced in the same manner as in Example 1, except that the aqueous dispersion of composite polymer P-1 used in the preparation of the coating liquid for back layer was changed to the following aqueous dispersion of composite polymer P-104 in Example 1.

Synthesis Example-10

Preparation of Aqueous Dispersion of Composite Polymer P-104

In a reaction vessel equipped with a stirring device and a dropping funnel and substituted with nitrogen gas, 14 parts of dimethylol butanoic acid, 57 parts of PLACCEL CD220 (trade name, polycarbonate diol (PCD), manufactured by Daicel Chemical Industries Limited., average molecular weight: 2000), 4 parts of a chain elongation agent (short chain diol component), 25 parts of the following compound A (both terminal polysiloxane diol), and a predetermined amount of acetone were added and uniformly dissolved to prepare a solution.

Then, a predetermined amount (NCO/OH 2.0) of hexamethylene diisocyanate (HDI) was added thereto, reacted at 80° C. until a predetermined NCO % was obtained, and cooled to 50° C. Ion-exchange water in an amount of 30% by mass with respect to the solid content and a neutralizer (triethylamine (TEA)) in a predetermined amount (an amount equivalent to hydrophilic group —COOH) were further added thereto, the system was uniformly emulsified, and an ethylenediamine (EDI) component (in an amount equivalent to the actual measurement NCO %) was added for chain elongation. Acetone in the system was collected by vacuum deairing.

As mentioned above, an aqueous dispersion of composite polymer P-104 having a polysiloxane structural units and urethane structural units as non-polysiloxane structural units was prepared.

The aqueous dispersion of composite polymer P-104 contained about 25% by mass of the polysiloxane moiety and about 75% by mass of the urethane polymer moiety in the polymer.

The solid concentration of the aqueous dispersion of composite polymer P-104 was 42%.

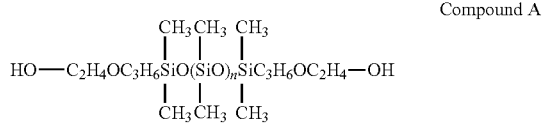

Compound A (Both terminal polysiloxane diol, n: integer, average molecular weight: 1,900)

Example 14

A back sheet was produced in the same manner as in Example 1, except that the crosslinking agent used in the preparation of the coating liquid for back layer was changed to the following isocyanate compound (H-4) in Example 1.
Isocyanate compound (TAKELAC W-6061, trade name, manufactured by Mitsui Chemicals, Inc., solid content: 25% by mass)

Example 15

A back sheet was produced in the same manner as in Example 1, except that both surfaces of the polymer base material PET-1 were surface treated by the following corona treatment condition in Example 1.
[Corona Treatment Condition]
Apparatus: Solid state corona treatment apparatus 6KVA model, manufactured by Pillar Technologies
Gap clearance between electrode and dielectric roll: 1.6 mm
Treatment frequency: 9.6 kHz
Treatment speed: 20 m/min
Treatment intensity: 0.375 kV·A·min/m$^2$ Example 16

A back sheet was produced in the same manner as in Example 15, except that the surface treatment condition for both surfaces of the polymer base material PET-1 was changed to the following flame treatment condition in Example 15.
[Flame Treatment Condition]
While PET-1 was conveyed, flame generated by burning a mixed gas of propane gas and air (volume ratio=1/17) was applied to the surface of PET-1 for 0.5 seconds using a wide burner.

Example 17

A back sheet was produced in the same manner as in Example 15, except that the surface treatment condition for both surfaces of the polymer base material PET-1 was changed to the following low pressure plasma treatment condition in Example 15.

[Low Pressure Plasma Treatment Condition]
While PET-1 was conveyed, plasma which was generated by discharge using a 3.56 MHz high frequency discharge apparatus and had a power of 1000 W·min/m$^2$ was applied to the surface of PET-1 for 15 seconds in an atmosphere of a plasma gas (gas pressure: 1.5 Ton) prepared by mixing oxygen gas and argon gas (volume ratio=80/20).

Example 18

A back sheet was produced in the same manner as in Example 15, except that the surface treatment condition for both surfaces of the polymer base material PET-1 was changed to the following atmospheric pressure plasma treatment condition in Example 15.
[Atmospheric Pressure Plasma Treatment Condition]
While PET-1 was conveyed, plasma which was generated by discharge using a 5 Hz high frequency discharge apparatus and had a power of 250 W·min/m$^2$ was applied to the surface of PET-1 for 15 seconds in an atmosphere of a plasma gas (gas pressure: 750 Torr) prepared by mixing air and argon gas.

Example 19

A back sheet was produced in the same manner as in Example 15, except that the surface treatment condition for both surfaces of the polymer base material PET-1 was changed to the following ultraviolet treatment condition in Example 15.
[Ultraviolet Treatment Condition]
While PET-1 was conveyed, ultraviolet light generated using a low pressure mercury lamp was applied to the surface of PET-1 for 20 seconds in an atmospheric pressure.

Example 20

A back sheet was produced in the same manner as in Example 15, except that the crosslinking agent used in the preparation of the coating liquid for back layer was changed to the following carbodiimide compound (H-3) in Example 15.
Carbodiimide compound (crosslinking agent, H-3) (CARBODILITE V-02-L2, trade name, manufactured by Nisshinbo Chemical, Inc.; solid content: 25% by mass)

Example 21

A back sheet was produced in the same manner as in Example 20, except that the composition of the coating liquid for back layer was changed to the following composition of coating liquid for back layer 4 in Example 20.
<Composition of Coating Liquid for Back Layer 4>

| | |
|---|---|
| Aqueous dispersion of composite polymer P-1 (Binder, Solid concentration 42% by mass) | 45.9 parts |
| Carbodiimide compound (crosslinking agent, H-3) (CARBODILITE V-02-L2, trade name, manufactured by Nisshinbo Chemical, Inc.; solid content: 25% by mass) | 0.4 parts |
| Polyoxyalkylene alkyl ether (NAROACTY CL95, manufactured by Sanyo Chemical Industries, Ltd.; solid content: 1% by mass) | 2.0 parts |
| Distilled water | 51.7 parts |

Example 22

A back sheet was produced in the same manner as in Example 20, except that the composition of the coating liquid for back layer was changed to the following composition of coating liquid for back layer 5 in Example 20.

<Composition of Coating Liquid for Back Layer 5>

| | |
|---|---|
| Aqueous dispersion of composite polymer P-1 (Binder, Solid concentration 42% by mass) | 45.9 parts |
| Carbodiimide compound (crosslinking agent, H-3) (CARBODILITE V-02-L2, trade name, manufactured by Nisshinbo Chemical, Inc.; solid content: 25% by mass) | 30.8 parts |
| Polyoxyalkylene alkyl ether (NAROACTY CL95, manufactured by Sanyo Chemical Industries, Ltd.; solid content: 1% by mass) | 2.0 parts |
| Distilled water | 21.3 parts |

Example 23

A back sheet was produced in the same manner as in Example 20, except that the dry thickness of the back layer was changed to 0.5 μm in Example 20.

Example 24

A back sheet was produced in the same manner as in Example 20, except that the dry thickness of the back layer was changed to 15 μm in Example 20.

Example 25

A back sheet was produced in the same manner as in Example 20, except that the coating liquid for back layer was changed to the following coating liquid containing white pigment 6 in Example 20.

[Preparation of Coating Liquid Containing White Pigment 6]

The following components were mixed to prepare a coating liquid containing white pigment 6 for back layer containing white pigment.

<Composition of Coating Liquid Containing White Pigment 6>

| | |
|---|---|
| Aqueous dispersion of composite polymer P-1 (Binder, Solid concentration 42% by mass) | 45.9 parts |
| Carbodiimide compound (crosslinking agent, H-3) (CARBODILITE V-02-L2, trade name, manufactured by Nisshinbo Chemical, Inc.; solid content: 25% by mass) | 5.4 parts |
| Oxazoline compound (crosslinking agent, H-1) (EPOCROS WS-700, trade name, manufactured by Nippon Shokubai Co., Ltd.; solid content: 25% by mass) | 2.3 parts |
| Polyoxyalkylene alkyl ether (NAROACTY CL95, manufactured by Sanyo Chemical Industries, Ltd.; solid content: 1% by mass) | 2.0 parts |
| Following white pigment dispersion | 33.0 parts |
| Distilled water | 11.4 parts |

—Preparation of White Pigment Dispersion—

The components in the following composition were mixed, and the mixture was subjected to a dispersion treatment for one hour using a Dynomill type dispersing machine.

<Composition of White Pigment Dispersion>

| | |
|---|---|
| Titanium dioxide (volume average particle diameter = 0.42 μm) (TIPAQUE R-780-2, trade name, manufactured by Ishihara Sangyo Kaisha, Ltd.; solid content: 100% by mass) | 39.9 mass % |
| Polyvinyl alcohol (PVA-105, trade name, manufactured by Kuraray Co., Ltd.; solid content: 10% by mass) | 8.0 mass % |
| Surfactant (DEMOL EP, trade name, manufactured by Kao Corp.; solid content: 25% by mass) | 0.5 mass % |
| Distilled water | 51.6 mass % |

(Evaluations)

For the back sheets produced in the above Examples and Comparative Examples, the following evaluations were carried out. The evaluation results are shown in the following Table 2.

—Evaluation of Adhesiveness—

(1) Adhesiveness Before Lapse of Time in Presence of Moisture and Heat

Six cuts were inserted on the surface of the back layer of the back sheet in the longitudinal direction and the transverse direction, respectively, using a single-blade razor, and thereby 25 squares were formed. Mylar tape (polyester tape) was adhered thereon, and the tape was peeled by manually pulling the tape along the sample surface in the 180° direction. At this time, the adhesive power of the back layer was ranked according to the following evaluation criteria based on the number of peeled squares. The evaluation ranks 4 and 5 fall in the practically acceptable range.

<Evaluation Criteria>

5: There were no peeled squares (0 squares).

4: The number of peeled squares was from 0 squares to less than 0.5 squares.

3: The number of peeled squares was from 0.5 squares to less than 2 squares.

2: The number of peeled squares was from 2 squares to less than 10 squares.

1: The number of peeled squares was 10 squares or greater.

(2) Adhesiveness after Lapse of Time in Presence of Moisture and Heat

The back sheet was maintained for 48 hours under the environmental conditions of 120° C. and 100% RH, and then was subjected to humidity adjustment for one hour in an environment at 25° C. and 60% RH. Then, the adhesive power of the back layer was evaluated by the same method as that used in the evaluation of the "(1) Adhesiveness before lapse of time in presence of moisture and heat."

(3) Adhesiveness after Immersion in Water

The back sheet was immersed in distilled water at 25° C. for 16 hours, and then the moisture on the surface was wiped out in an environment at 25° C. and 60% RH. Subsequently, the adhesive power of the back layer was immediately evaluated by the same method as that used in the evaluation of the "(1) Adhesiveness before lapse of time in presence of moisture and heat."

(4) Adhesiveness after Further Lapse of Time in Presence of Moisture and Heat

The back sheets with evaluation rank 5 in the evaluation criteria in the evaluation of the "(2) Adhesiveness after lapse of time in presence of moisture and heat" were maintained for 80 hours under the environmental conditions of 120° C. and 100% RH, and then were subjected to humidity adjustment for one hour in an environment at 25° C. and 60% RH. Then, the adhesive power of the back layer was evaluated by the same method as that used in the evaluation of the "(1) Adhesiveness before lapse of time in presence of moisture and heat."

In this evaluation, the evaluation ranks 3 to 5 fall in the practically acceptable range.

(5) Adhesiveness after Irradiation of UV Light

With respect to the produced back sheet, using a super-energy irradiation test instrument (UE-1DEc type) manufactured by Suga Test Instruments Co., Ltd., light with an energy of 100 mW/cm$^2$ having a peak in ultraviolet wavelength region was irradiated on the surface of the back layer for 48 hours. Immediately after the irradiation, the adhesive power of the back layer was evaluated by the same method as that used in the evaluation of the "(1) Adhesiveness before lapse of time in presence of moisture and heat."

The temperature of the back sheet during the light irradiation was controlled to be 63° C.

TABLE 2

| Back sheet | Base material Type | Base material COOH group content eq/t | Base material Surface treatment | Back layer Composite polymer Type | Back layer Composite polymer Polysiloxane structural units Ratio [% by mass] (based on composite polymer) | Back layer Composite polymer Non-polysiloxane structural units Type | Back layer Crosslinking agent Type | Back layer Crosslinking agent Type | Back layer Crosslinking agent Addition amount [% by mass] (based on composite polymer) | White pigment | Dry thickness [μm] | Adhesiveness (1) Before lapse of time in presence of moisture and heat | Adhesiveness (2) After lapse of time in presence of moisture and heat | Adhesiveness (3) After immersion in water | Adhesiveness (4) After further lapse of time in presence of moisture and heat | Adhesiveness (5) After UV irradiation |
|---|---|---|---|---|---|---|---|---|---|---|---|---|---|---|---|---|
| Ex 1 | PET-1 | 30 | — | P-1 | 25 | acrylic | H-1 | oxazoline | 10 | absent | 3 | 5 | 5 | 5 | 4 | 4 |
| Ex 2 | PET-1 | 30 | — | P-2 | 50 | acrylic | H-1 | oxazoline | 10 | absent | 3 | 5 | 5 | 5 | 4 | 4 |
| Ex 3 | PET-1 | 30 | — | P-3 | 75 | acrylic | H-1 | oxazoline | 10 | absent | 3 | 5 | 5 | 5 | 4 | 4 |
| Comp. Ex 1 | PET-1 | 30 | — | P-4 | 13 | acrylic | H-1 | oxazoline | 10 | absent | 3 | 5 | 2 | 1 | — | 4 |
| Comp. Ex 2 | PET-1 | 30 | — | P-5 | 90 | acrylic | H-1 | oxazoline | 10 | absent | 3 | unable to evaluate due to bad surface state | | | | |
| Ex 4 | PET-1 | 30 | — | P-6 | 25 | acrylic | H-2 | epoxy | 10 | absent | 3 | 5 | 5 | 5 | 3 | 4 |
| Ex 5 | PET-1 | 30 | — | P-7 | 25 | acrylic | H-3 | carbodiimide | 10 | absent | 3 | 5 | 5 | 5 | 4 | 4 |
| Ex 6 | PET-1 | 30 | — | P-8 | 25 | acrylic | H-1 | oxazoline | 10 | absent | 1 | 5 | 5 | 5 | 4 | 4 |
| Ex 7 | PET-1 | 30 | — | P-9 | 25 | acrylic | H-1 | oxazoline | 10 | absent | 5 | 5 | 5 | 5 | 4 | 4 |
| Ex 8 | PET-1 | 30 | — | P-10 | 30 | acrylic | H-1 | oxazoline | 10 | absent | 3 | 5 | 5 | 5 | 4 | 4 |
| Ex 9 | PET-1 | 30 | — | P-11 | 75 | acrylic | H-1 | oxazoline | 10 | absent | 3 | 5 | 5 | 5 | 4 | 4 |
| Comp. Ex 3 | PET-1 | 30 | — | P-101 | 0 | ester | H-1 | oxazoline | 10 | absent | 3 | 5 | 2 | 2 | — | 4 |
| Comp. Ex 4 | PET-1 | 30 | — | P-102 | 0 | urethane | H-1 | oxazoline | 10 | absent | 3 | 5 | 2 | 2 | — | 4 |
| Ex 10 | PET-2 | 41 | — | P-8 | 25 | acrylic | H-1 | oxazoline | 10 | absent | 3 | 5 | 4 | 5 | 3 | 4 |
| Ex 11 | PET-3 | 53 | — | P-9 | 25 | acrylic | H-1 | oxazoline | 10 | absent | 3 | 5 | 4 | 5 | 3 | 4 |
| Ex 12 | PET-1 | 30 | — | P-1 | 25 | acrylic | — | — | — | absent | 3 | 5 | 5 | 4 | 3 | 4 |
| Ex 13 | PET-1 | 30 | — | P-104 | 25 | urethane | H-4 | isocyanate | 10 | absent | 3 | 5 | 5 | 4 | 3 | 4 |
| Ex 14 | PET-1 | 30 | — | P-1 | 25 | acrylic | H-1 | oxazoline | 10 | absent | 3 | 5 | 5 | 5 | 5 | 4 |
| Ex 15 | PET-1 | 30 | corona | P-1 | 25 | acrylic | H-1 | oxazoline | 10 | absent | 3 | 5 | 5 | 5 | 5 | 4 |
| Ex 16 | PET-1 | 30 | flame | P-1 | 25 | acrylic | H-1 | oxazoline | 10 | absent | 3 | 5 | 5 | 5 | — | 4 |
| Ex 17 | PET-1 | 30 | low pressure plasma | P-1 | 25 | acrylic | H-1 | oxazoline | 10 | absent | 3 | 5 | 5 | 5 | 5 | 4 |
| Ex 18 | PET-1 | 30 | atmospheric pressure plasma | P-1 | 25 | acrylic | H-1 | oxazoline | 10 | absent | 3 | 5 | 5 | 5 | 5 | 4 |
| Ex 19 | PET-1 | 30 | UV | P-1 | 25 | acrylic | H-1 | oxazoline | 10 | absent | 3 | 5 | 5 | 5 | 5 | 4 |
| Ex 20 | PET-1 | 30 | corona | P-1 | 25 | acrylic | H-3 | carbodiimide | 10 | absent | 3 | 5 | 5 | 5 | 5 | 4 |
| Ex 21 | PET-1 | 30 | corona | P-1 | 25 | acrylic | H-3 | carbodiimide | 0.5 | absent | 3 | 5 | 4 | 4 | — | 4 |
| Ex 22 | PET-1 | 30 | corona | P-1 | 25 | acrylic | H-3 | carbodiimide | 40 | absent | 3 | 5 | 4 | 4 | 3 | 4 |
| Ex 23 | PET-1 | 30 | corona | P-1 | 25 | acrylic | H-3 | carbodiimide | 10 | absent | 0.5 | 5 | 5 | 4 | 3 | 4 |
| Ex 24 | PET-1 | 30 | corona | P-1 | 25 | acrylic | H-3 | carbodiimide | 10 | absent | 15 | 5 | 5 | 4 | 4 | 4 |
| Ex 25 | PET-1 | 30 | corona | P-1 | 25 | acrylic | H-1 | oxazoline | 3 | present | 3 | 5 | 5 | 5 | 5 | 5 |

TABLE 2-continued

| Back sheet Type | Base material | | Back layer | | | | | | Adhesiveness | | | | |
|---|---|---|---|---|---|---|---|---|---|---|---|---|---|
| | | | Composite polymer | | | Crosslinking agent | | | (1) Before lapse of time in presence of moisture and heat | (2) After lapse of time in presence of moisture and heat | (3) After immersion in water | (4) After further lapse of time in presence of moisture and heat | (5) After UV irradiation |
| | COOH group content eq/t | Surface treatment | Type | Polysiloxane structural units Ratio [% by mass] (based on composite polymer) | Non-polysiloxane structural units Type | Type | Addition amount [% by mass] (based on composite polymer) | White pigment | Dry thickness [μm] | | | | |
| | | | | | | H-3 | carbodiimide | | 7 | | | | |

As shown in the Table 2, in Examples 1 to 25, back sheets having high adhesion durability in which the adhesiveness between the base material and the back layer was excellent after lapse of time in a hot and humid environment or under immersion in water were obtained.

In particular, back sheets having particularly high adhesion durability after lapse of time in a hot and humid environment or under immersion in water were obtained in the respective Examples including the Examples in which the structure or the content of the crosslinking agent contained in the polymer layer was within the preferable range, the Examples in which the non-siloxane structural units in the composite polymer were acrylic structural units, the Examples in which the polymer base material was subjected to a surface treatment, the Examples in which the polymer base material was polyester resin and had a carboxy group content within the preferable range, the Examples in which the thickness of the polymer layer was within the preferable range, and the Examples in which $R^1$ and $R^2$ in the siloxane structural units in the composite polymer were monovalent organic groups within the preferable range.

Further, in Example 25 in which the back layer contained white pigment, a back sheet having particularly high adhesion durability even after UV irradiation was obtained.

On the contrary, in the Comparative Examples, satisfactory surface state was not obtained, and even if the surface state was satisfactory, an adhesion durability that withstands a hot and humid environment was not obtained.

Example 26

A back sheet was produced in the same manner as in Example 1, except that the easy adhesion layer was formed as in Example 1, and then a back layer having a two-layer structure was formed as described below, and evaluation of the back sheet was performed. The evaluation results are presented in the following Table 4.

—Formation of Back Layer—

After the easy adhesion layer was formed, a coating liquid A for first back layer obtained as described below was applied on the side of the PET-1 where the reflective layer and the easy adhesion layer were not formed, such that the binder amount was 3.0 g/m² as a wet coating amount, and the coating liquid A was dried for one minute at 180° C. Thus, a first back layer having a dry thickness of 3 μm was formed. Subsequently, a coating liquid B for second back layer obtained as described below was applied on the first back layer such that the binder amount was 2.0 g/m² as a wet coating amount, and the coating liquid B was dried for one minute at 180° C. Thus, a second back layer having a dry thickness of 2 μm was formed.

[Preparation of Coating Liquid A for First Back Layer]

The components in the following composition were mixed, and thus a coating liquid A for first back layer was prepared.

<Composition for Coating Liquid A>

| | |
|---|---|
| Aqueous dispersion of composite polymer P-1 (Solid concentration 42% by mass) | 45.9 parts |
| Oxazoline compound (crosslinking agent, H-1) (EPOCROS WS-700, trade name, manufactured by Nippon Shokubai Co., Ltd.; solid content: 25% by mass) | 7.7 parts |
| Polyoxyalkylene alkyl ether (NAROACTY CL95, trade name, manufactured by Sanyo Chemical Industries, Ltd.; solid content: 1% by mass) | 2.0 parts |
| Pigment dispersion shown below | 33.0 parts |
| Distilled water | 11.4 parts |

—Preparation of Pigment Dispersion—

The following components were mixed, and then the mixture was subjected to a dispersion treatment for one hour using a Dynomill type dispersing machine.

<Composition>

| | |
|---|---|
| Titanium dioxide (volume average particle diameter = 0.42 μm) (TIPAQUE R-780-2, trade name, manufactured by Ishihara Sangyo Kaisha, Ltd.; solid content 100% by mass) | 39.9 mass % |
| Polyvinyl alcohol (PVA-105, trade name, manufactured by Kuraray Co., Ltd.; solid content: 10% by mass) | 8.0 mass % |
| Surfactant (DEMOL EP, trade name, manufactured by Kao Corp.; solid content: 25% by mass) | 0.5 mass % |
| Distilled water | 51.6 mass % |

[Preparation of Coating Liquid B for Second Back Layer]

The components in the following composition were mixed, and thus a coating liquid B for second back layer was prepared.

<Composition of Coating Liquid>

| | |
|---|---|
| Aqueous dispersion of composite polymer P-3 (Solid concentration 42% by mass) | 45.9 parts |
| Oxazoline compound (crosslinking agent, H-1) (EPOCROS WS-700, trade name, manufactured by Nippon Shokubai Co., Ltd.; solid content: 25% by mass) | 7.7 parts |
| Polyoxyalkylene alkyl ether (NAROACTY CL95, trade name, manufactured by Sanyo Chemical Industries, Ltd.; solid content: 1% by mass) | 2.0 parts |
| Pigment dispersion shown above | 33.0 parts |
| Distilled water | 11.4 parts |

Examples 27 to 31

Back sheets were produced in the same manner as in Example 26, except that the types of the aqueous dispersions of composite polymer used in the first back layer and the second back layer, the type and the amount of the crosslinking agent, the surface treatment, and the presence of white pigment were changed as indicated in the following Table 3, and evaluation of the back sheets was performed. The evaluation results are presented in the following Table 4.

In addition, the details of the P-10, P-11 and P-103 are as follows.

P-10: CERANATE WSA1070 (trade name)

(Polysiloxane moiety: about 30%, polymer moiety: about 70%, manufactured by DIC Corp.)

P-11: CERANATE WSA1060 (trade name)

(Polysiloxane moiety: about 75%, polymer moiety: about 25%, manufactured by DIC Corp.)

P-103: OBBLIGATO (trade name, manufactured by AGC Coat-Tech Co., Ltd.)

(Fluorine binder that does not have a polysiloxane moiety)

TABLE 3

| | | | First Back layer | | | | | | | |
|---|---|---|---|---|---|---|---|---|---|---|
| | Base material | | | Composite polymer | | Crosslinking agent | | | | |
| Back sheet | Type | COOH group content [eq/t] | Surface treatment | Type | Polysiloxane structural units Ratio [% by mass] (based on composite polymer) | Non-polysiloxane structural units Type | Type | Type | Addition amount [% by mass] (based on composite polymer) | White pigment | Dry thickness [µm] |
| Ex 26 | PET-1 | 30 | — | P-1 | 25 | acrylic | H-1 | oxazoline | 10 | present | 3 |
| Ex 27 | PET-1 | 30 | — | P-1 | 25 | acrylic | H-1 | oxazoline | 10 | present | 3 |
| Ex 28 | PET-1 | 30 | — | P-10 | 30 | acrylic | H-1 | oxazoline | 10 | present | 3 |
| Ex 29 | PET-1 | 30 | — | P-10 | 30 | acrylic | H-1 | oxazoline | 10 | present | 3 |
| Ex 30 | PET-1 | 30 | — | P-10 | 30 | acrylic | H-1 | oxazoline | 10 | present | 3 |
| Ex 31 | PET-1 | 30 | corona | P-10 | 30 | acrylic | H-1 / H-3 | oxazoline / carbodiimide | 3 / 7 | present | 3 |

| | | Second Back layer | | | | | | |
|---|---|---|---|---|---|---|---|---|
| | | Composite polymer | | Crosslinking agent | | | | |
| Back sheet | Type | Polysiloxane structural units Ratio [% by mass] (based on composite polymer) | Non-polysiloxane structural units Type | Type | Type | Addition amount [% by mass] (based on composite polymer) | White pigment | Dry thickness [µm] |
| Ex 26 | P-3 | 75 | acrylic | H-1 | oxazoline | 10 | present | 2 |
| Ex 27 | P-103 | — | acrylic | H-1 | oxazoline | 10 | present | 2 |
| Ex 28 | P-10 | 30 | acrylic | H-1 | oxazoline | 10 | present | 2 |
| Ex 29 | P-11 | 75 | acrylic | H-1 | oxazoline | 10 | present | 2 |
| Ex 30 | P-103 | — | acrylic | H-1 | oxazoline | 10 | present | 2 |
| Ex 31 | P-10 | 30 | acrylic | H-3 | carbodiimide | 10 | absent | 2 |

TABLE 4

| | Adhesiveness | | | | |
|---|---|---|---|---|---|
| | (1) Before lapse of time in presence of moisture and heat | (2) After lapse of time in presence of moisture and heat | (3) After immersion in water | (4) After further lapse of time in presence of moisture and heat | (5) After UV irradiation |
| Example 26 | 5 | 5 | 5 | 4 | 5 |
| Example 27 | 5 | 5 | 5 | 4 | 5 |
| Example 28 | 5 | 5 | 5 | 4 | 5 |
| Example 29 | 5 | 5 | 5 | 4 | 5 |
| Example 30 | 5 | 5 | 5 | 4 | 5 |
| Example 31 | 5 | 5 | 5 | 5 | 5 |

As shown in the Table 4, the back sheets of Examples 26 to 31 had satisfactory adhesion durability even when exposed to a hot and humid environment or under immersion in water.

Example 32

A reinforced glass having a thickness of 3 mm, an EVA sheet (SC50B, manufactured by Mitsui Chemicals Fabro, Inc.), a crystalline solar cell, an EVA sheet (SC50B, manufactured by Mitsui Chemicals Fabro, Inc.), and the back sheet of Example 1 were superimposed in this sequence, and the assembly was hot pressed using a vacuum laminator (manufactured by Nisshinbo Chemical, Inc.; vacuum laminating machine) to thereby adhere the assembly with EVA. At this time, the back sheet produced in Example 1 was disposed such that the easy adhesion layer was in contact with the EVA sheet. Furthermore, the adhesion method was as follows.

As discussed above, a crystalline solar cell module was produced. The produced solar cell module was operated to generate power, and the solar cell module exhibited satisfactory power generation performance as a solar cell.

<Adhesion Method>

A vacuum was created for 3 minutes at 128° C. using a vacuum laminator, and then the assembly was pressed for 2 minutes to preliminarily bond the assembly. Thereafter, a main adhesion treatment was carried out at 150° C. for 30 minutes in a dry oven.

Examples 33 to 37

Crystalline solar cell modules were produced in the same manner as in Example 32, except that the back sheet in Example 32 was replaced with the back sheets produced in Examples 2, 3, 8, 9 and 25.

The solar cell modules thus obtained were used to operate and generate power, and all of them exhibited satisfactory power generation performance as solar cells.

Examples 38 to 43

Crystalline solar cell modules were produced in the same manner as in Example 32, except that the back sheet in Example 32 was replaced with the back sheets produced in Examples 26 to 31.

The solar cell modules thus obtained were used to operate and generate power, and all of them exhibited satisfactory power generation performance as solar cells.

Example 44

The following coating liquid for reflective layer 2 was applied on one side of the PET-1 produced in the same manner as in Example 1, and was dried for one minute at 180° C. Thus, a white layer (reflective layer; dry thickness=about 2 μm) having an amount of titanium dioxide of 6.5 g/m² was formed as a pigment layer. Furthermore, an easy adhesion layer was formed thereon in the same manner as in Example 1, and thereby a back sheet was produced.

—Preparation of Coating Liquid for Reflective Layer 2—

The components in the following composition were mixed, and thus a coating liquid for reflective layer 2 was prepared.

<Composition of Coating Liquid 2>

| | |
|---|---|
| Pigment dispersion used in the preparation of the coating liquid for reflective layer 1 of Example 1 | 80.0 parts |
| Aqueous dispersion of composite polymer P-1 (Solid concentration 42% by mass) | 13.7 parts |
| Polyoxyalkylene alkyl ether (NAROACTY CL95, manufactured by Sanyo Chemical Industries, Ltd.; solid content: 1% by mass) | 3.0 parts |
| Oxazoline compound (crosslinking agent, H-1) (EPOCROS WS-700, manufactured by Nippon Shokubai Co., Ltd.; solid content: 25% by mass) | 2.0 parts |
| Distilled water | 13.3 parts |

—Evaluation of Adhesiveness—

For the back sheet produced in Example 44, the adhesiveness between the sealing material and the back sheet before a lapse of time and after a lapse of time in the presence of moisture and heat, and the adhesiveness after a further lapse of time in the presence of moisture and heat were evaluated by the methods described below. The evaluation results are presented in the following Table 5.

(A) Adhesiveness Before Lapse of Time in Presence of Moisture and Heat

The back sheet produced as described above was cut to a size of 20 mm in width×150 mm, and two sheets of sample pieces were prepared. These two sheets of sample pieces were disposed such that the respective easy adhesion layers faced the inner side. An EVA sheet (EVA sheet manufactured by Mitsui Chemicals Fabro, Inc.; SC50B) which had been previously cut to a size of 20 mm in width×100 mm in length, was disposed therebetween, and the assembly was hot pressed using a vacuum laminator (vacuum laminating machine, manufactured by Nisshinbo Chemical, Inc.) to adhere the easy adhesion layers with EVA. The conditions for adhesion were as follows.

A vacuum was created for 3 minutes at 128° C. using a vacuum laminator, and then the assembly was pressed for 2 minutes to preliminarily bond the assembly. Thereafter, a main adhesion treatment was carried out at 150° C. for 30 minutes in a dry oven. As such, there was obtained a sample for adhesion evaluation, in which two sheets of sample pieces adhered to each other were not adhered to EVA in an area of 20 mm from one edge, and the sample pieces were adhered to the EVA sheet in the remaining area of 100 mm in length.

The EVA-unadhered area of the sample for adhesion evaluation thus obtained was clamped with upper and lower clips in a Tensilon (RTC-1210A, trade name, manufactured by Orientec Co., Ltd.), and a pulling test was performed at a peeling angle of 180° and at a pulling speed of 300 mm/min. Thus, the adhesive power was measured.

The sample was ranked according to the following evaluation criteria, based on the measured adhesive power. The evaluation ranks 4 and 5 fall in the practically acceptable range.

<Evaluation Criteria>

5: Adhesion was very satisfactory (60 N/20 mm or greater).

4: Adhesion was satisfactory (from 30 N/20 mm to less than 60 N/20 mm).

3: Adhesion was slightly poor (from 20 N/20 mm to less than 30 N/20 mm).

2: Adhesion failure occurred (from 10 N/20 mm to less than 20 N/20 mm).

1: Adhesion failure was significant (less than 10 N/20 mm).

(B) Adhesiveness after Lapse of Time in Presence of Moisture and Heat

The sample for adhesion evaluation thus obtained was maintained for 1000 hours in the environment conditions of 85° C. and 85% RH (a lapse of time in the presence of moisture and heat), and then the adhesive power was measured by the same method as in the above section (A). The sample was ranked according to the above evaluation criteria, based on the measured adhesive power. The evaluation ranks 4 and 5 fall in the practically acceptable range.

(C) Adhesiveness after Further Lapse of Time in Presence of Moisture and Heat

The sample for adhesion evaluation obtained in the same manner as in the above (A) was maintained for 3000 hours in the environment conditions of 85° C. and 85% RH (a further lapse of time in the presence of moisture and heat), and then the adhesive power was measured by the same method as in the above section (A). The sample was ranked according to the above evaluation criteria, based on the measured adhesive power. In this evaluation, the evaluation ranks 3, 4 and 5 fall in the practically acceptable range.

Examples 45 to 48

Back sheet samples were produced in the same manner as in Example 44, except that the aqueous dispersion of composite polymer P-1 used in the preparation of the coating liquid for reflective layer 2 in Example 44 was replaced as indicated in the following Table 5, and evaluation of the samples was performed. The evaluation results are presented in the following Table 5.

for preparation of the coating liquid for reflective layer 2 was not used in Example 44, and evaluation of the sample was performed. The evaluation results are presented in the following Table 5.

Example 50

A back sheet was produced in the same manner as in Example 44, except that both surfaces of the polymer base material PET-1 were surface treated by the following corona treatment condition in Example 44, and evaluation of the sample was performed. The evaluation results are presented in the following Table 5.

[Corona Treatment Condition]

Apparatus: Solid state corona treatment apparatus 6 KVA model, manufactured by Pillar Technologies Gap clearance between electrode and dielectric roll: 1.6 mm Treatment frequency: 9.6 kHz Treatment speed: 20 m/min Treatment intensity: 0.375 kV·A·min/m$^2$

TABLE 5

| Back sheet | Base material | | | Reflective layer | | | | |
|---|---|---|---|---|---|---|---|---|
| | | | | Composite polymer | | | Crosslinking agent | |
| | Type | COOH group content eq/t | Surface treatment | Type | Polysiloxane structural units Ratio [% by mass] (based on composite polymer) | Non-polysiloxane structural units Type | Type | Type | Addition amount [% by mass] (based on composite polymer) |
| Example 44 | PET-1 | 30 | — | P-1 | 25 | acrylic | H-1 | oxazoline | 10 |
| Example 45 | PET-1 | 30 | — | P-2 | 50 | acrylic | H-1 | oxazoline | 10 |
| Example 46 | PET-1 | 30 | — | P-3 | 75 | acrylic | H-1 | oxazoline | 10 |
| Example 47 | PET-1 | 30 | — | P-10 | 30 | acrylic | H-1 | oxazoline | 10 |
| Example 48 | PET-1 | 30 | — | P-11 | 75 | acrylic | H-1 | oxazoline | 10 |
| Example 49 | PET-1 | 30 | — | P-1 | 25 | acrylic | — | — | — |
| Example 50 | PET-1 | 30 | corona | P-1 | 25 | acrylic | H-1 | oxazoline | 10 |

| | Reflective layer | | Adhesiveness to sealing material | | |
|---|---|---|---|---|---|
| Back sheet | White pigment | Dry thickness [μm] | (A) Before lapse of time in presence of moisture and heat | (B) After lapse of time in presence of moisture and heat | (C) After further lapse of time in presence of moisture and heat |
| Example 44 | present | 2 | 5 | 5 | 4 |
| Example 45 | present | 2 | 5 | 5 | 4 |
| Example 46 | present | 2 | 5 | 5 | 4 |
| Example 47 | present | 2 | 5 | 5 | 4 |
| Example 48 | present | 2 | 5 | 5 | 4 |
| Example 49 | present | 2 | 5 | 5 | 3 |
| Example 50 | present | 2 | 5 | 5 | 5 |

Example 49

A back sheet sample was produced in the same manner as in Example 44, except that the crosslinking agent H-1 used As shown in the Table 5, the back sheets of the invention had satisfactory adhesion durability even when exposed to a hot and humid environment.

Examples 51 to 57

Using the back sheet samples produced in Examples 44 to 50, after the formation of an easy adhesion layer, a back layer having a two-layer structure composed of a first back layer and a second back layer was formed on the side opposite to the side where the reflective layer and the easy adhesion layer were provided in each of the back sheets in the same manner as in Example 26. Thus, back sheets were produced. These back sheets were used to produce solar cell modules by the same method as that used in Example 32.

The solar cell modules thus produced were used to operate and generate power, and all of them exhibited satisfactory power generation performance as solar cells.

Examples 58 to 85

Solar cell modules were produced in the same manner as in Examples 51 to 57, respectively, except that the aqueous dispersions of composite polymer used in the first back layer and the second back layer for Examples 51 to 57 were changed in the same manner as in Examples 27 to 30 shown in the Table 3.

The solar cell modules thus produced were used to operate and generate power, and all of them exhibited satisfactory power generation performance as solar cells.

Example 86

The following coating liquid for adhesive layer was applied on one side of the PET-1 produced by the same method as that used in Example 1 such that the binder amount was 7.1 g/m² as a wet coating amount, and the coating liquid was dried for one minute at 180° C. to form an adhesive layer having a dry thickness of 0.15 μm. Subsequently, A coating liquid for reflective layer 3 as shown below was applied on this adhesive layer, and was dried for one minute at 180° C., to thereby form a white layer (reflective layer; dry thickness=about 11 μm) having an amount of titanium dioxide of 6.5 g/m² as a pigment layer. On this white layer, an easy adhesion layer was formed in the same manner as in Example 1, and thereby a back sheet was produced.

—Preparation of Coating Liquid for Adhesive Layer—

The components in the following composition were mixed, and thus a coating liquid for adhesive layer was prepared.

<Composition of Coating Liquid>

| | |
|---|---|
| CERANATE WSA1070 (trade name, composite polymer (P-10); polysiloxane moiety: about 30%, polymer moiety: about 70%, manufactured by DIC Corp.) | 3.6 parts |
| Oxazoline compound (crosslinking agent, H-1) (EPOCROS WS-700, trade name, manufactured by Nippon Shokubai Co., Ltd.; solid content; 25% by mass) | 1 part |
| Polyoxyalkylene alkyl ether (NAROACTY CL95, trade name, manufactured by Sanyo Chemical Industries, Ltd.; solid content: 1% by mass) | 1.5 parts |
| Distilled water | 93.9 parts |

—Preparation of Coating Liquid for Reflective Layer 3—

The components in the following composition were mixed, and thus a coating liquid for reflective layer 3 was prepared.

<Composition of Coating Liquid 3>

| | |
|---|---|
| Pigment dispersion used in the preparation of the coating liquid for reflective layer 1 of Example 1 | 80.0 parts |
| CHEMIPEARL S75N (trade name) (Solid concentration 24% by mass, manufactured by Mitsui Chemicals, Inc.) (Polyolefin binder that does not have a polysiloxane moiety, P-105) | 9 parts |
| Polyoxyalkylene alkyl ether (NAROACTY CL95, trade name, manufactured by Sanyo Chemical Industries, Ltd.; solid content: 1% by mass) | 3.0 parts |
| Oxazoline compound (crosslinking agent, H-1) (EPOCROS WS-700, trade name, manufactured by Nippon Shokubai Co., Ltd.; solid content: 25% by mass) | 2.0 parts |
| Distilled water | 6 parts |

—Evaluation of Adhesiveness—

For the back sheet thus produced, the adhesiveness was evaluated by the method described below. The evaluation results are presented in the following Table 6-2.

(i) Adhesiveness Before Lapse of Time in Presence of Moisture and Heat

The back sheet produced as described above was cut to a size of 20 mm in width×150 mm, and two sheets of sample pieces were prepared. These two sheets of sample pieces were disposed such that the respective easy adhesion layers faced the inner side. An EVA sheet (EVA sheet manufactured by Mitsui Chemicals Fabro, Inc.; SC50B, trade name) which had been previously cut to a size of 20 mm in width×100 mm in length, was disposed therebetween, and the assembly was hot pressed using a vacuum laminator (vacuum laminating machine, manufactured by Nisshinbo Chemical, Inc.) to adhere the easy adhesion layers with EVA. At this time, a vacuum was created for 3 minutes at 128° C. using a vacuum laminator, and then the assembly was pressed for 2 minutes to preliminarily bond the assembly. Thereafter, a main adhesion treatment was carried out at 150° C. for 30 minutes in a dry oven. As such, there was obtained a sample for adhesion evaluation, in which two sheets of sample pieces adhered to each other were not adhered to EVA in an area of 20 mm from one edge, and the sample pieces were adhered to the EVA sheet in the remaining area of 100 mm in length.

The EVA-unadhered area of the sample for adhesion evaluation thus obtained was clamped with upper and lower clips in a Tensilon (RTC-1210A, trade name, manufactured by Orientec Co., Ltd.), and a pulling test was performed at a peeling angle of 180° and at a pulling speed of 300 mm/min. Thus, the adhesive power was measured. The sample was ranked according to the following evaluation criteria, based on the measured adhesive power. The evaluation ranks 4 and 5 fall in the practically acceptable range.

<Evaluation Criteria>

5: Adhesion between the reflective layer and the adhesive layer was very satisfactory (60 N/20 mm or greater).

4: Adhesion between the reflective layer and the adhesive layer was satisfactory (from 30 N/20 mm to less than 60 N/20 mm).

3: Adhesion between the reflective layer and the adhesive layer was slightly poor (from 20 N/20 mm to less than 30 N/20 mm).

2: Adhesion failure between the reflective layer and the adhesive layer occurred (from 10 N/20 mm to less than 20 N/20 mm).

1: Adhesion failure between the reflective layer and the adhesive layer was significant (less than 10 N/20 mm).

(ii) Adhesiveness after Lapse of Time in Presence of Moisture and Heat

The sample for adhesion evaluation thus obtained was maintained for 1000 hours in the environment conditions of 85° C. and 85% RH (a lapse of time in the presence of moisture and heat), and then the adhesive power was measured by the same method as in the above section (i). The sample was ranked according to the above evaluation criteria, based on the measured adhesive power. The evaluation ranks 4 and 5 fall in the practically acceptable range.

(iii) Adhesiveness after Further Lapse of Time in Presence of Moisture and Heat

The sample for adhesion evaluation obtained in the above (i) was maintained for 3000 hours in the environment conditions of 85° C. and 85% RH (a further lapse of time in the presence of moisture and heat), and then the adhesive power was measured by the same method as in the above section (i). The sample was ranked according to the above evaluation criteria, based on the measured adhesive power. In this evaluation, the evaluation ranks 3, 4 and 5 fall in the practically acceptable range.

(iv) Adhesiveness after Immersion in Water

The sample for adhesion evaluation thus obtained was immersed in distilled water at 70° C. for 7 days, and then the moisture on the surface was wiped out in an environment at 25° C. and 60% RH. Subsequently, six cuts were immediately inserted on the surface of the white layer of the sample-58 in the longitudinal direction and the transverse direction, respectively, using a single-blade razor, and thereby 25 squares were formed. Mylar tape (polyester tape) was adhered thereon, and the tape was peeled by manually pulling the tape along the sample surface in the 90° direction. At this time, the adhesive power of the reflective layer was ranked according to the following evaluation criteria based on the number of peeled squares. The evaluation ranks 4 and 5 fall in the practically acceptable range.

<Evaluation Criteria>

5: There were no peeled squares (0 squares).

4: The number of peeled squares was more than 0 squares and less than 0.5 squares.

3: The number of peeled squares was from 0.5 squares to less than 2 squares.

2: The number of peeled squares was from 2 squares to less than 10 squares.

1: The number of peeled squares was 10 squares or greater.

Examples 87 to 92 and Comparative Examples 5 to 7

Back sheets were produced in the same manner as in Example 86, except that the type of the polymer and the type of the crosslinking agent used in the preparation of the coating liquid for adhesive layer and the coating liquid for reflective layer 3 in Example 86 were changed as indicated in the following Tables 6-1 and 6-2, and evaluation of the back sheets was performed. The evaluation results are presented in the following Table 6-2.

P-106: VYLONAL MD1200 (trade name, manufactured by Toyobo Co., Ltd., polyester binder that does not have a polysiloxane moiety)

P-107: PESRESIN A520 (trade name, manufactured by Takamatsu Oil & Fat Co., Ltd., polyester binder that does not have a polysiloxane moiety)

Example 93

A back sheet was produced in the same manner as in Example 92, except that the easy adhesion layer formed on the reflective layer was not formed by coating, and evaluation of the back sheet was performed. The evaluation results are presented in the following Table 6-2.

Example 94

A back sheet was produced in the same manner as in Example 93, except that the crosslinking agents were not added to the adhesive layer and the reflective layer, and evaluation of the back sheet was performed. The evaluation results are presented in the following Table 6-2.

Example 95

A back sheet was produced in the same manner as in Example 93, except that both surfaces of the polymer base material PET-1 were surface treated by the following corona treatment condition in Example 93.

[Corona Treatment Condition]

Apparatus: Solid state corona treatment apparatus 6 KVA model, manufactured by Pillar Technologies Gap clearance between electrode and dielectric roll: 1.6 mm Treatment frequency: 9.6 kHz Treatment speed: 20 m/min Treatment intensity: 0.375 kV·A·min/m$^2$

TABLE 6-1

| | Base material | | | Adhesive layer | | | | | |
| | | | | Composite polymer | | | Crosslinking agent | | |
| Back sheet | Type | COOH group content [eq/t] | Surface treatment | Type | Polysiloxane structural units Ratio [% by mass] (based on composite polymer) | Non-polysiloxane structural units | Type | Type | Addition amount [% by mass] (based on composite polymer) | Dry thickness [μm] |
|---|---|---|---|---|---|---|---|---|---|---|
| Ex 86 | PET-1 | 30 | — | P-10 | 30 | acrylic | H-1 | oxazoline | 17 | 0.15 |
| Ex 87 | PET-1 | 30 | — | P-10 | 30 | acrylic | H-3 | carbodiimide | 17 | 0.15 |
| Ex 88 | PET-1 | 30 | — | P-10 | 30 | acrylic | H-1 | oxazoline | 5 | 0.15 |
| | | | | | | | H-3 | carbodiimide | 12 | |
| Ex 89 | PET-1 | 30 | — | P-11 | 75 | acrylic | H-1 | oxazoline | 17 | 0.15 |
| Ex 90 | PET-1 | 30 | — | P-11 | 75 | acrylic | H-3 | carbodiimide | 17 | 0.15 |
| Ex 91 | PET-1 | 30 | — | P-11 | 75 | acrylic | H-1 | oxazoline | 5 | 0.15 |
| | | | | | | | H-3 | carbodiimide | 12 | |
| Ex 92 | PET-1 | 30 | — | P-10 | 30 | acrylic | H-1 | oxazoline | 5 | 0.15 |
| | | | | | | | H-3 | carbodiimide | 12 | |
| Comp. Ex 5 | PET-1 | 30 | — | P-106 + | 0 | ester + | H-3 | carbodiimide | 17 | 0.15 |

TABLE 6-1-continued

| | Base material | | | Adhesive layer | | | | | | |
|---|---|---|---|---|---|---|---|---|---|---|
| | | | | Composite polymer | | | Crosslinking agent | | | |
| Back sheet | Type | COOH group content [eq/t] | Surface treatment | Type | Polysiloxane structural units Ratio [% by mass] (based on composite polymer) | Non-polysiloxane structural units | Type | Type | Addition amount [% by mass] (based on composite polymer) | Dry thickness [μm] |
| Comp. Ex 6 | PET-1 | 30 | — | P-107 P-4 | 13 | olefin acrylic | H-1 | oxazoline | 17 | 0.15 |
| Comp. Ex 7 | PET-1 | 30 | — | P-5 | 90 | acrylic | H-1 | oxazoline | 17 | 0.15 |
| Ex 93 | PET-1 | 30 | — | P-10 | 30 | acrylic | H-1 H-3 | oxazoline carbodiimide | 5 12 | 0.15 |
| Ex 94 | PET-1 | 30 | — | P-10 | 30 | acrylic | — | — | — | 0.15 |
| Ex 95 | PET-1 | 30 | corona | P-10 | 30 | acrylic | H-1 H-3 | oxazoline carbodiimide | 5 12 | 0.15 |

TABLE 6-2

| | Reflective layer | | | | | | |
|---|---|---|---|---|---|---|---|
| | Composite polymer | | | Crosslinking agent | | | |
| Back sheet | Type | Polysiloxane structural units Ratio [% by mass] (based on composite polymer) | Non-polysiloxane structural units | Type | Type | Addition amount [% by mass] (based on composite polymer) | White pigment | Dry thickness [μm] |
| Ex 86 | P-105 | 0 | olefin | H-1 | oxazoline | 23 | present | 11 |
| Ex 87 | P-105 | 0 | olefin | H-1 | oxazoline | 23 | present | 11 |
| Ex 88 | P-105 | 0 | olefin | H-1 | oxazoline | 23 | present | 11 |
| Ex 89 | P-105 | 0 | olefin | H-1 | oxazoline | 23 | present | 11 |
| Ex 90 | P-105 | 0 | olefin | H-1 | oxazoline | 23 | present | 11 |
| Ex 91 | P-105 | 0 | olefin | H-1 | oxazoline | 23 | present | 11 |
| Ex 92 | P-10 | 30 | acrylic | H-1 H-3 | oxazoline carbodiimide | 5 12 | present | 11 |
| Comp. Ex 5 | P-105 | 0 | olefin | H-1 | oxazoline | 23 | present | 11 |
| Comp. Ex 6 | P-105 | 0 | olefin | H-1 | oxazoline | 23 | present | 11 |
| Comp. Ex 7 | P-105 | 0 | olefin | H-1 | oxazoline | 23 | present | 11 |
| Ex 93 | P-10 | 30 | acrylic | H-1 H-3 | oxazoline carbodiimide | 5 12 | present | 11 |
| Ex 94 | P-10 | 30 | acrylic | — | — | — | present | 11 |
| Ex 95 | P-10 | 30 | acrylic | H-1 H-3 | oxazoline carbodiimide | 5 12 | present | 11 |

| | | Adhesiveness to sealing material | | | |
|---|---|---|---|---|---|
| Back sheet | Easy adhesion layer | (i) Before lapse of time in presence of moisture and heat | (ii) After lapse of time in presence of moisture and heat | (iii) After further lapse of time in presence of moisture and heat | (iv) After immersion in water |
| Ex 86 | present | 5 | 4 | 3 | 4 |
| Ex 87 | present | 5 | 5 | 3 | 4 |
| Ex 88 | present | 5 | 5 | 3 | 4 |
| Ex 89 | present | 5 | 5 | 3 | 4 |
| Ex 90 | present | 5 | 5 | 3 | 4 |
| Ex 91 | present | 5 | 5 | 3 | 4 |
| Ex 92 | present | 5 | 5 | 4 | 5 |
| Comp. Ex 5 | present | 5 | 3 | — | 1 |
| Comp. Ex 6 | present | 5 | 3 | — | 1 |
| Comp. Ex 7 | present | unable to evaluate due to bad surface state | | | |
| Ex 93 | absent | 5 | 5 | 4 | 5 |
| Ex 94 | absent | 5 | 5 | 3 | 4 |
| Ex 95 | absent | 5 | 5 | 5 | 5 |

As shown in the Tables 6-1 and 6-2, the back sheets of the invention had satisfactory adhesion durability even when exposed to a hot and humid environment and when placed in heated water.

Examples 96 to 105

Using the back sheet samples produced in Examples 86 to 95, after the formation of an easy adhesion layer, a back layer having a two-layer structure composed of a first back layer and a second back layer was formed on the side opposite to the side where the reflective layer and the like were provided in each of the back sheets in the same manner as in Example 26. Thus, back sheets were produced. These back sheets were used, and thus solar cell modules were produced by the same method as that used in Example 32.

The produced solar cell modules were used to operate and generate power, and all of them exhibited satisfactory power generation performance as solar cells.

Japanese Patent Application Nos. 2010-037869, 2010-254209 and 2011-035131 are incorporated herein by reference.

All publications, patent applications, and technical standards mentioned in this specification are herein incorporated by reference to the same extent as if each individual publication, patent application, or technical standard was specifically and individually indicated to be incorporated by reference.

The invention claimed is:

1. A back sheet for a solar cell to be disposed in contact with a sealing material of a cell-side substrate in which a solar cell device is sealed with the sealing material, the back sheet comprising:
   a polymer base material comprising a polyester resin having a carboxy group content with respect to the polyester resin in a range of from 2 equivalents/ton to 35 equivalents/ton; and
   a polymer layer that is provided on the polymer base material and comprises a composite polymer that contains in a molecule, with respect to the composite polymer, 15% by mass to 85% by mass of siloxane structural units represented by the following formula (1) and 85% by mass to 15% by mass of non-siloxane structural units comprising acrylic structural units:

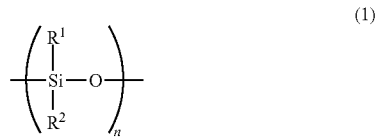

(1)

wherein $R^1$ and $R^2$ each independently represent a hydrogen atom, a halogen atom, or a monovalent organic group; $R^1$ and $R^2$ may be identical with or different from each other; n is an integer of 1 or more; when a plurality of $R^1$s are present, they may be identical with or different from each other; and when a plurality of $R^2$s are present, they may be identical with or different from each other, said polymer layer also comprising a structural portion derived from an oxazoline crosslinking agent for crosslinking the composite polymer, wherein in the polymer layer a mass content of the structural portion derived from the oxazoline crosslinking agent is from 10% by mass to 30% by mass based on a content of the composite polymer.

2. The back sheet for a solar cell according to claim 1, wherein the polymer base material has been subjected to at least one surface treatment selected from the group consisting of a corona treatment, a flame treatment, a low pressure plasma treatment, an atmospheric pressure plasma treatment, and an ultraviolet treatment.

3. The back sheet for a solar cell according to claim 1, wherein the monovalent organic group represented by $R^1$ or $R^2$ is at least one selected from the group consisting of an alkyl group, an aryl group, an aralkyl group, an alkoxy group, an aryloxy group, a mercapto group, an amino group and an amide group.

4. The back sheet for a solar cell according to claim 1, wherein the polymer layer has a thickness of from 0.8 μm to 12 μm.

5. The back sheet for a solar cell according to claim 4, wherein the polymer layer is provided in contact with a surface of the polymer base material.

6. The back sheet for a solar cell according to claim 4, wherein the polymer layer is an outermost layer which is disposed at the most distant position from the polymer base material.

7. The back sheet for a solar cell according to claim 4, wherein the polymer layer further contains a white pigment and is a reflective layer having light reflectivity.

8. The back sheet for a solar cell according to claim 4, comprising at least two of the polymer layers, wherein one of the polymer layers further contains a white pigment and is a reflective layer having light reflectivity, and another of the polymer layers is disposed between the reflective layer and the polymer base material.

9. The back sheet for a solar cell according to claim 5, further comprising a reflective layer which contains a white pigment and has light reflectivity, wherein the polymer layer is disposed between the reflective layer and the polymer base material.

10. A method for producing a back sheet for a solar cell, the method comprising forming at least one polymer layer by applying, on a polymer base material comprising a polyester resin having a carboxy group content with respect to the polyester resin in a range of from 2 equivalents/ton to 35 equivalents/ton, a coating liquid containing a composite polymer that contains in a molecule, with respect to the composite polymer, 15% by mass to 85% by mass of siloxane structural units represented by the following formula (1) and 85% by mass to 15% by mass of non-siloxane structural units comprising acrylic structural units:

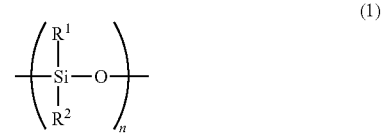

(1)

wherein $R^1$ and $R^2$ each independently represent a hydrogen atom, a halogen atom, or a monovalent organic group; $R^1$ and $R^2$ may be identical with or different from each other; n is an integer of 1 or more; when a plurality of $R^1$s are present, they may be identical with or different from each other; and when a plurality of $R^2$s are present, they may be identical with or different from each other, said polymer layer also comprising a structural portion derived from an oxazoline crosslinking agent for crosslinking the composite polymer, wherein in the polymer layer a mass content of the structural portion derived from the oxazoline crosslinking agent is from 10% by mass to 30% by mass based on a content of the composite polymer.

11. The method for producing a back sheet for a solar cell according to claim 10, wherein the coating liquid further contains oxazoline crosslinking agent for providing the structural portion derived from the oxazoline crosslinking agent for crosslinking the composite polymer in the polymer layer.

12. The method for producing a back sheet for a solar cell according to claim 10, wherein the coating liquid further contains a solvent, and 50% by mass or more of the solvent is water.

13. A solar cell module comprising the back sheet for a solar cell according to claim 1.

14. A solar cell module comprising:
- a transparent front substrate through which sunlight enters;
- a cell structural portion which is provided on the front substrate and comprises a solar cell device and a sealing material that seals the solar cell device; and
- the back sheet for a solar cell according to claim 1, provided on a side of the cell structural portion opposite to a side thereof on which the front substrate is provided, so as to be adjacent to the sealing material.

* * * * *